(12) United States Patent
Tsuyuzaki

(10) Patent No.: US 8,001,168 B2
(45) Date of Patent: Aug. 16, 2011

(54) RANDOM PULSE GENERATION SOURCE, AND SEMICONDUCTOR DEVICE, METHOD AND PROGRAM FOR GENERATING RANDOM NUMBER AND/OR PROBABILITY USING THE SOURCE

(76) Inventor: Noriyoshi Tsuyuzaki, Mobara (JP)

( * ) Notice: Subject to any disclaimer, the term of this patent is extended or adjusted under 35 U.S.C. 154(b) by 1217 days.

(21) Appl. No.: 11/630,678

(22) PCT Filed: Jun. 28, 2005

(86) PCT No.: PCT/JP2005/012288
§ 371 (c)(1),
(2), (4) Date: Dec. 27, 2006

(87) PCT Pub. No.: WO2006/004075
PCT Pub. Date: Jan. 12, 2006

(65) Prior Publication Data
US 2007/0271320 A1 Nov. 22, 2007

(30) Foreign Application Priority Data
Jun. 30, 2004 (JP) ................................ 2004-193456

(51) Int. Cl.
*G06F 1/02* (2006.01)
(52) U.S. Cl. ..................................................... 708/255
(58) Field of Classification Search ........... 708/250–256
See application file for complete search history.

(56) References Cited

U.S. PATENT DOCUMENTS

| | | | |
|---|---|---|---|
| 4,197,170 A | 4/1980 | Malson et al. | 204/1.5 |
| 6,542,014 B1 * | 4/2003 | Saito | 327/164 |
| 7,080,106 B2 * | 7/2006 | Ikeda et al. | 708/250 |
| 2002/0159590 A1 * | 10/2002 | Ikeda | 380/46 |
| 2003/0090306 A1 * | 5/2003 | Saito | 327/164 |
| 2005/0198091 A1 * | 9/2005 | Saito | 708/250 |

FOREIGN PATENT DOCUMENTS

| | | |
|---|---|---|
| EP | 0 015 807 A1 | 9/1980 |
| FR | 2 748 596 A1 | 11/1997 |
| JP | 11-296348 A | 10/1999 |
| JP | 2000-305753 A | 11/2000 |
| JP | 2002-149398 A | 5/2002 |
| JP | 2003-16396 A | 1/2003 |
| JP | 2003-337928 A | 11/2003 |
| WO | 97/29820 A1 | 8/1997 |
| WO | 99/41834 A1 | 8/1999 |

OTHER PUBLICATIONS

Office Action mailed Mar. 30, 2011, issued in Japanese patent application No. 2005-187750, and English translation thereof.

* cited by examiner

*Primary Examiner* — Tan V Mai
(74) *Attorney, Agent, or Firm* — Kubovcik & Kubovcik

(57) ABSTRACT

The present invention provides a semiconductor device such as an IC capable of generating completely random signals and generating an authentication signal, random number, and probability by integrally setting a random pulse generation source for spontaneously generating at the inside, and also provides a method/program for generating a random number and/or probability, comprising the steps of setting a random pulse generation source (hereafter referred to as RPG) for spontaneously generating random pulses, measuring the time interval between the random pulses generated from the RPG or measuring a voltage value of the random pulse, and converting it into a digital value, and generating an exponential distribution random number and/or uniform random number having a predetermined bit length and/or a probability from random pulses as converted to digital values.

27 Claims, 8 Drawing Sheets

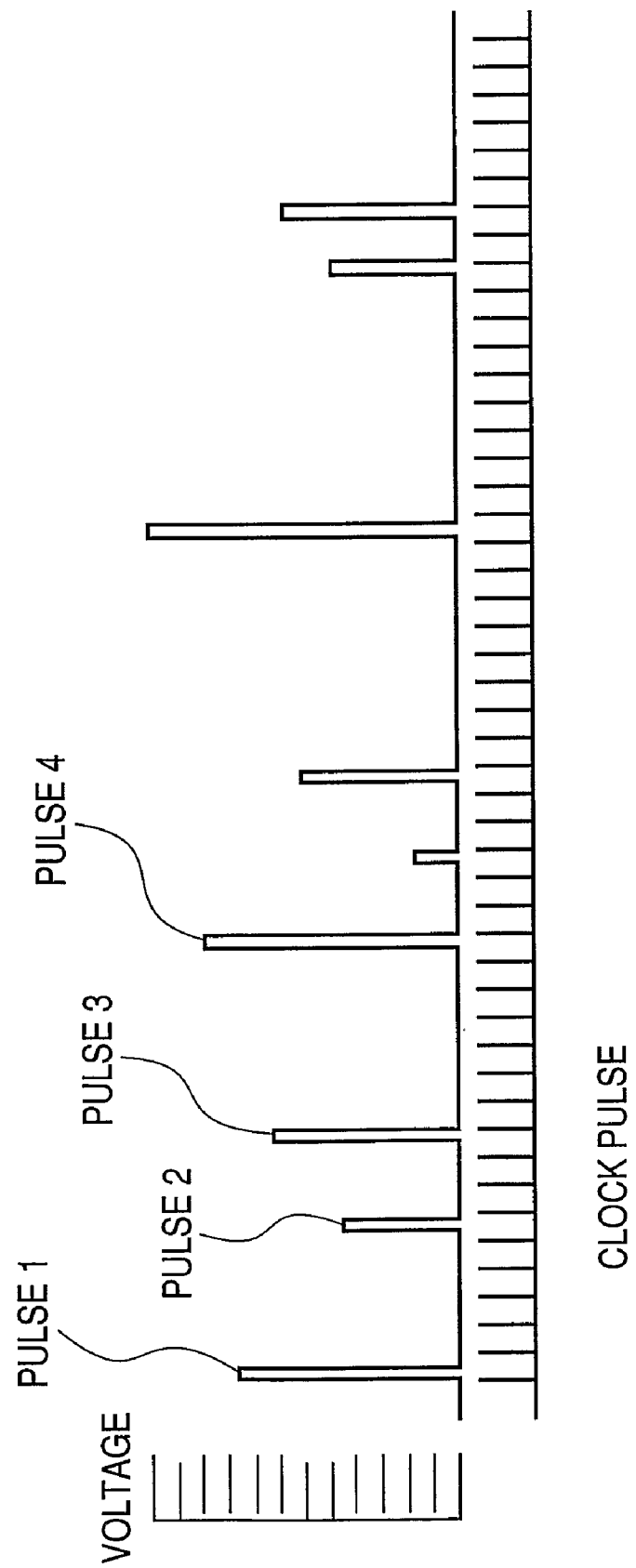

RANDOM PULSE GENERATION SOURCE, AND SEMICONDUCTOR DEVICE, METHOD AND PROGRAM FOR GENERATING RANDOM NUMBER AND/OR PROBABILITY USING THE SOURCE

This application is a 371 of international application PCT/JP2005/012288, which claims priority based on Japanese patent application No. 2004-193456 filed Jun. 30, 2004, which is incorporated herein by reference.

TECHNICAL FIELD

The present invention relates to a random pulse generation source provided with an α-particle emitter for spontaneously generating complete random pulses, a semiconductor device such as an IC having such a random pulse generation source integrally fitted therein and capable of generating completely random signals and preparing an authentication signal, random number, and probability, and method and program for generating random number and/or probability using the source.

BACKGROUND ART

An IC tag whose security is improved is disclosed in Japanese Patent Laid-Open Nos. 2003-337928 and 2003-16396. The IC tag disclosed in the former official gazette has a configuration of storing a power through connection with a terminal, generating a one-time password by a CPU in the IC by means of the power, holding the password in a memory, and deleting the held password when the stored power is discharged and the IC tag disclosed in the latter official gazette has a configuration of reading authentication data from the tag twice or more and using a pseudo random value as authentication data.

DISCLOSURE OF THE INVENTION

However, these IC tags do not include a generator for generating completely random signals or a function for generating such signals. In the case of this type of the authentication IC, a storage circuit is built in, authentication data is obtained by receiving a signal from the outside through radio communication or infrared communication or generated in an IC chip and the data is written in the storage circuit. Moreover, the data stored in an IC chip at the receiving side can be read from the outside and therefore, the data is weak in confidentiality and has a problem on security. Furthermore, when using random number data in order to differentiate ICs, a pseudo random number prepared by a program at the transmitting side is frequently used and therefore, holding of secret at the transmitting side is indispensable. Moreover, there is vulnerability that regularity can be estimated from random number data, the number of combinations is restricted, and it is misdoubted that a plurality of same identification numbers are mixed. When using the IC tag for pursuit, a problem occurs that individual information is accumulated at the pursuit side and the IC tag becomes a spread inhibition factor.

Moreover, in the case of an authentication device such as an electronic lock, an authentication signal generating function is not included in a chip in the case of a convention IC used to authenticate the other party. For anti-clone (anti-counterfeit), an authentication signal is sent from the outside through radio or infrared communication and this authentication data is stored in a storage device in a chip, and the other party is recognized as a correct one when the authentication data coincides with the data stored at the transmitting source. Therefore, when completely copying the stored data, it is impossible to judge true or false by the transmitting source. Therefore, there is a problem on security similarly to the case of the above IC tag.

Moreover, there is an IC in which a random number generator using thermal noise or noises is built in. Thermal noises or noises are influenced by a change of environments such as electromagnetic waves. Therefore, it is necessary to handle not only a completely random signal but also a pseudo random number and therefore and reliability is restricted. In the case of a system using noises, random numbers generated in accordance with the noises are phenomenologically disordered. However, there is no logical corroboration about the performance of a random number other than those based on various evaluation methods.

The present invention is developed to eliminate the above-described conventional problem.

A random pulse generator (generation source) (hereafter referred to as RPG) of the present invention is constituted so as to include an emitter for discharging α particles or beta rays, or α-particles and beta rays discharged due to nuclear decay, and a detector for detecting discharged α-particles or the like, and use the emitter as a solution and drip the solution on the detection face of the detector.

An RPG of the present invention is also constituted so as to include an emitter for discharging α particles or beta rays, or α particles and beta rays discharged due to nuclear decay, and a detector for detecting discharged α particles or the like, characterized in that the emitter is used as a solution, a member on which the solution is evaporated or which is formed into a panel by e.g. the roller method is faced with the detector, spacing a predetermined distance.

Moreover, a semiconductor device including an IC, relating to the present invention is constituted so as to generate a random number and/or probability by using a random pulse generation source for spontaneously generating random pulses, measuring a time interval between random pulses generated from the RPG or a voltage value, and converting the interval or voltage value into a digital value.

For example, when applying the present invention to an authentication device, a random pulse generator (RPG) having a discharge source of α-particles endlessly discharged due to natural decay is built in an IC body and a completely random signal is obtained from the RPG to use the signal as an authentication signal. That is, an IC chip always generates an authentication signal to rewrite the signal to new authentication data for every authentication so that a copy does not make sense. In this case, almost endless combinations of authentication signals can be made without using a program, management of authentication data is made unnecessary at the IC chip fabrication side, and it is possible to establish complete security at the user side having an IC chip.

Moreover, though details will be described later, in the case of the present invention, it is possible to easily prepare a complete random number and probability from a signal of an RPG in an IC chip. Thereby, by providing the IC, a random number and probability can be easily used.

The present invention is not influenced by an environmental condition at all, an original signal generation source which cannot be artificially controlled is built in an IC body, and a random signal generated by an IC is used as a source signal for generating an authentication signal, random number, and probability. Thereby, it is possible to construct an authentication system which cannot be artificially operated and in which safety is established.

Moreover, storage of data is unnecessary at the authentication-system supply side and it is possible to greatly decrease the cost. It is possible to handle uniform random numbers generated by the present invention as complete random numbers and the system can be used as a probability generator to which artificial dishonesty cannot be applied.

The present invention is also directed to a method/program for generating a random number and/or probability, comprising the steps of setting a random pulse generation source (hereafter referred to as RPG) for spontaneously generating random pulses, measuring the time interval between the random pulses generated from the RPG or measuring a voltage value of the random pulse, and converting it into a digital value, and generating an exponential distribution random number and/or uniform random number having a predetermined bit length and/or a probability from random pulses as converted to digital values.

The method/program is characterized in that the step of generating an exponential distribution random number and/or uniform random number having a predetermined bit length and/or a probability from random pulses, obtains a necessary number of probabilities from an exponential distribution showing a probability in which the same pulse interval occurs between pulses generated from the RPG to prepare a uniform random number in accordance with the probability.

The method/program is also characterized in that the step of generating an exponential distribution random number and/or uniform random number having a predetermined bit length and/or a probability from random pulses, recognizes, in obtaining a probability from the time interval between t1 and t2 by using the exponential distribution, a pulse having a predetermined probability when exceeding the time t1 by assuming that the time t2 is infinite time.

The method/program is also characterized in that the step of generating an exponential distribution random number and/or uniform random number having a predetermined bit length and/or a probability from random pulses, realizes, in preparing a random number from an exponential distribution, an appearance probability density distribution in which an exponential distribution random number and uniform distribution random number are stabilized, by fluctuating a basic cycle for measurement and performing the same computation even if the average discharge rate of pulses is fluctuated.

The method/program is characterized in that the step of generating an exponential distribution random number and/or uniform random number having a predetermined bit length and/or a probability from random pulses, stabilizes a distribution of exponential distribution random numbers by fluctuating a basic cycle for measurement when preparing a random number from an exponential distribution and processes generation of a uniform distribution random number and generation of a probability simultaneously.

The method/program is also characterized in that the step of generating an exponential distribution random number and/or uniform random number having a predetermined bit length and/or a probability from random pulses, automatically corrects fluctuation of an operation clock for an oscillation frequency of hardware such as microcomputer for measuring time by fluctuating a basic cycle for measurement when preparing a random number form an exponential distribution.

BRIEF DESCRIPTION OF THE DRAWINGS

FIG. 9 is an illustration showing a RPG output pulse.

BEST MODE FOR CARRYING OUT THE INVENTION

Figure 1:
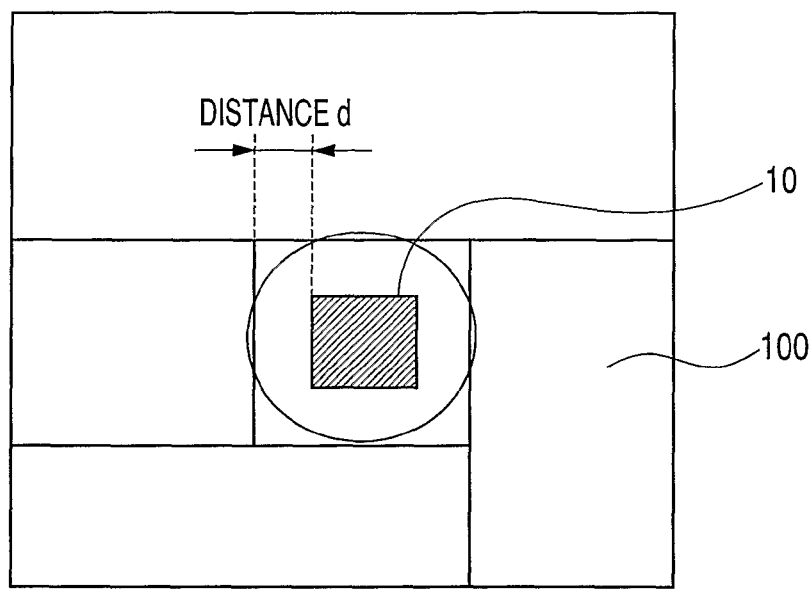
FIG. 1 is an illustration showing a setting example of an α-particle emitter to an IC tag.

Specific description is made by taking an RPG-RFID (Radio Frequency Identification) chip to which a function of a radio tag is added as an example. However, the present invention is not restricted to the example. It is a matter of course that the present invention can be applied to another semiconductor device such as an IC for generating an authentication signal, random number, or probability.

Moreover, it is possible to apply the present invention to an IC card, IC tag, PC connectable unit, unit built-in module, etc. including a random pulse generation source (RPG) to be described below and moreover apply the present invention to an IC card, IC tag, PC connectable unit, unit built-in module, etc. including a semiconductor device constituted so as to generate a random number and/or probability by measuring a time interval between random pulses generated from the RPG or voltage value and converting the value into a digital value.

An IC tag of the present invention has the following structure. An RPG (random pulse generator) for generating complete random pulses is used by improving a pulse generator using α particles disclosed in Japanese Patent No. 2926539 obtained by the present inventor. An α-particle emitter uses one of $^{241}$Am, $^{244}$Cm, $^{210}$Pb-$^{210}$Po, $^{210}$Po, etc. which are naturally decayed. More specifically, it is possible to use all nuclear species of uranium series, all nuclear species of thorium series, and all nuclear species of $^{210}$Pb-$^{210}$Po, etc. forming the radioactive equilibrium between these nuclear species, $^{244}$Cm, or $^{241}$Am. Moreover, it is allowed to use an RPG for generating random pulses by using beta rays or gamma rays as long as an IC tag is used for a portion having a shield setting space at an IC tag use destination.

Because α particles, beta rays, and gamma rays are not influenced by an environment such as temperature, pressure, humidity, or electromagnetic waves, it is impossible to artificially operate them. This specific IC cannot be realized by other method and the IC is important factor to secure safety. An IC tag used for a portion for which complete safety is not requested can use an RPG using a thermal noise or jitter of a semiconductor as a random pulse generation source.

An RPG-RFID chip of an IC tag includes an RPG, electronic circuit for making it possible to use a random pulse transmitted from the RPG as an authentication signal, circuit for storing the authentication signal, storage device, circuit for transmitting an authentication signal corresponding to the conformation of communication, antenna, communication device, etc. As for power supply, RF energy is supplied from the antenna in the case of the RPG-RFID chip. However, it is also allowed to use a terminal and supply a power via the terminal when there is a setting space for the terminal.

In the case of an authentication procedure of the RPG-RFID chip, random signals (generation time and time interval between pulses) from the built-in RPG are written, as authentication signals of the RPG-RFID chip, in an inside storage device. The stored signals are fetched from the outside by using communication means with the RPG-RFID chip or through connection by direct contact to confirm that there is not a combination of same authentication signals in the same lot.

When an RPG-RFID chip to be shipped is used for specific commodity management and a distribution range is comparatively restricted in management of moving information or the like since the time of shipment, the authentication signal of each RPG-RFID chip is read through communication before shipment, stored, and used.

The authentication procedure and storage of authentication data are performed for every communication to replace the authentication data with random signals generated by the RPG-RFID chip.

An embodiment of an RPG-RFID chip provided with a random pulse generator (RPG) of the present invention is described in detail by referring to the accompanying drawings.

First, a random pulse generator (RPG) for spontaneously generating random pulses is described.

The RPG is constituted of an α-particle emitter, and PN-type semiconductor, PNP-type semiconductor, PIN photodiode, phototransistor, photodiode or the like at the central portion of the RPG-RFID chip shown in FIG. 1. The device of the pulse generator is selected in accordance with the safety level requested for the RPG-RFID chip. In FIG. 1, reference numeral 10 denotes a position where an α-particle emitter and a detector are set, and 100 denotes a base substance (silicon base).

Figure 2:
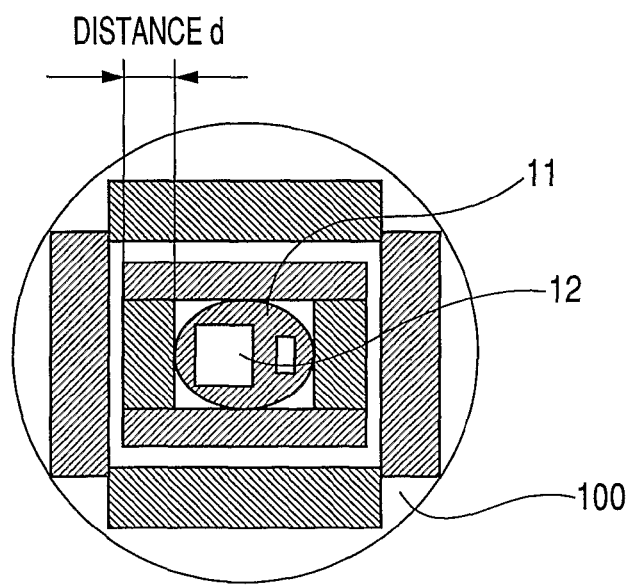
FIG. 2 is an enlarged view of an α-particle emitter setting portion.

FIG. 2 shows a structure around the α-particle detector of the RPG-RFID chip to which the α-particle emitter is set. The α-particles (He atoms) discharged from the α-particle emitter are not influenced by an environment such as temperature, pressure, or electromagnetic waves, a power supply is also unnecessary, and α particles are semipermanently discharged in accordance with the half-life. That is, this system is characterized in that it is possible to use a signal source which cannot be artificially operated at all for an original signal used for authentication. Therefore, this system becomes a signal generation source which cannot be changed at all from the outside. When complete safety is not requested for the setting portion of this IC, it is also allowed to use e.g. a diode for generating noises for a pulse generator. In FIG. 2, reference numeral 11 denotes an evaporated or dripped α-particle emitter and 12 denotes a detector.

To incorporate an α-particle emitter into an IC, there are the following two methods: a method using a member on which an α-particle emitter is evaporated or which is formed like a disk by a roll method and a method of dripping the solution of an α-particle emitter (also including injection by ink jet system).

Figure 3:
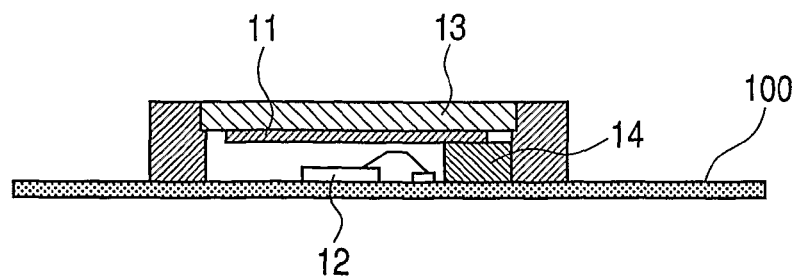
FIG. 3 is an enlarged view of an α-particle emitter setting portion (setting example when the α-particle emitter is discoid)

In the case of the method for incorporating the α-particle emitter formed like a disk, the α-particle emitter is set immediately above an α-particle detection diode. There are the following two setting methods: a method for setting a spacer so that the distance between the detection diode and the α-particle emitter becomes a predetermined distance and mounting the α-particle emitter on the spacer and a method for setting the α-particle emitter by adhering it to a sealing plate. FIG. 3 shows a set structure. In FIG. 3, reference numeral 11 denotes an α-particle emitter, 12 denotes a detector; 13 denotes a sealing plate, and 14 denotes a spacer for setting the distance between the emitter and the detector.

The following is a method for constituting a detector by dripping the solution of an α-particle emitter. (Refer to FIGS. 4A to 4C.)

The volume including the circumference of a detector to which the solution is dripped is first calculated to obtain a volume of the solution which does not flow to the outside. The quantity of the solution to be dripped is made equal to the volume. The number of atoms of the α-particle emitter included in the dripping quantity is obtained so that a predetermined pulse number is obtained and a concentration is adjusted before dripping the emitter so that the concentration is obtained.

Figure 4A:
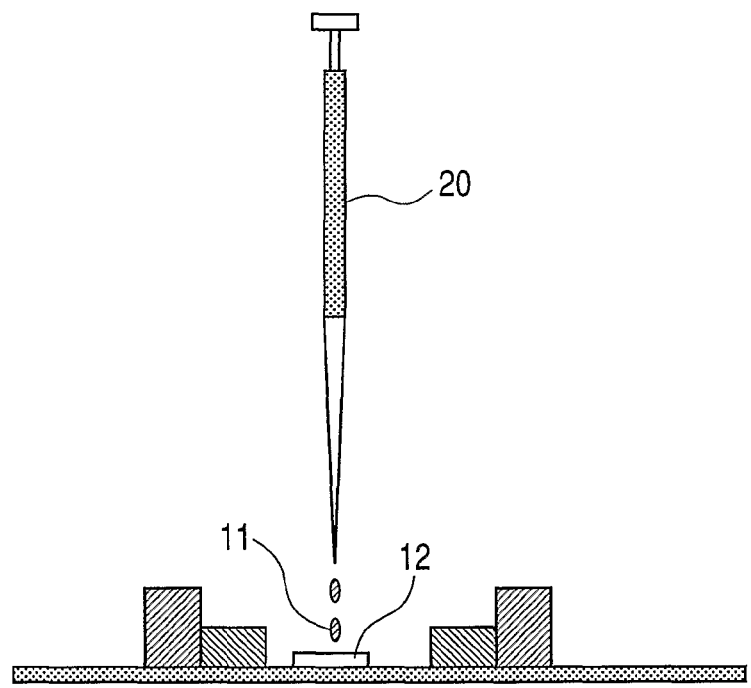
FIG. 4A is an illustration showing dripping of an α-particle emitter and sealing example.
Figure 4B:
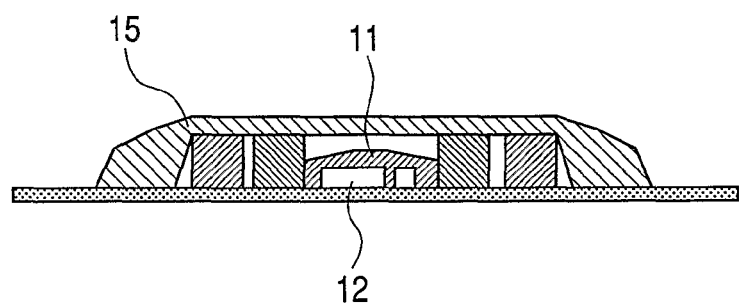
FIG. 4B is an illustration showing dripping of an α-particle emitter and sealing example.
Figure 4C:
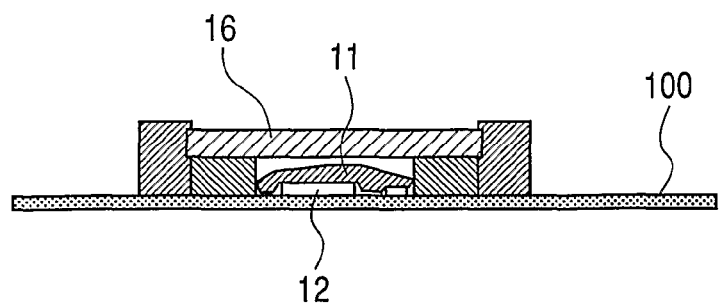
FIG. 4C is an illustration showing dripping of an α-particle emitter and sealing example.

A necessary quantity is absorbed by a dripping jig such as a microsyringe 20 and the solution 11' of a previously-decided quantity of an α-particle emitter is extruded to drip the solution 11' on the surface of the detector 12 (refer to FIG. 4A). After dripping the solution 11', the detector 12 is sealed by a sealing material 15 such as epoxy (refer to FIG. 4B) or sealed by a sealing disk 16 (refer to FIG. 4C). The same procedure is used for a case in which the solution is dripped in accordance with injection of the solution by using an ink jet system.

The distance between the α-particle emitter and the circuit portion (distance d in FIGS. 1 and 2) is taken larger than the range of α particles obtained by the following expression in order to prevent a malfunction due to α particles.

Figure 7:
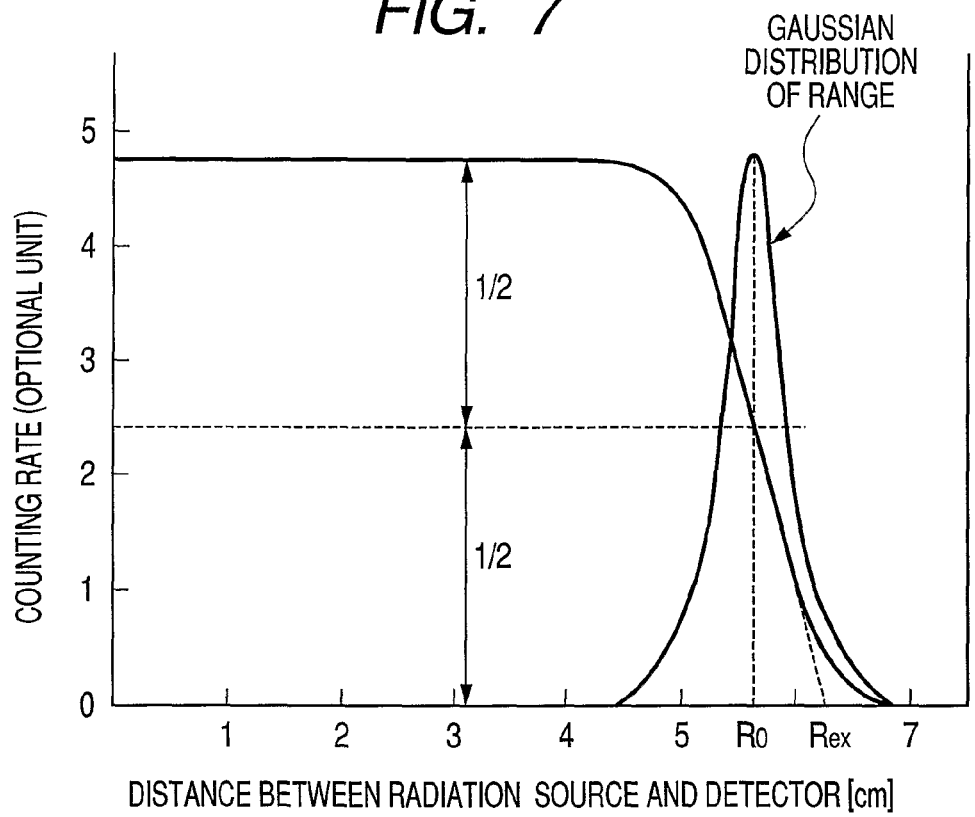
FIG. 7 is a graph showing a relation between distance between α-particle emitter and detector and counting rate of α particles.

FIG. 7 shows a general range of α particles in air. The axis of abscissa denotes the distance between α-particle emitter and detector and the axis of ordinate denotes discrete value (optional unit). The calculation when using $^{210}$Pb-$^{210}$Po for an α-particle emitter is shown below.

A relation between energy E (MeV) of α particles and range R (cm) in air is well examined and is shown by the Geiger's expression.

$$E = 2.12 R^{2/3} \quad (4 < E < 7)$$

$$R = 0.323 E^{3/2} \quad (3 < R < 7)$$

Thus, the range of Po α particles is shown below.

$$R = 0.323 \times (5.305)^{\frac{3}{2}} \quad \text{[Formula 1]}$$
$$= 0.323 \times 12.2188$$
$$= 3.94667 \text{ cm}$$

The range Rs (cm) of α particles in a solid substance is obtained from the following Bragg-Kleeman's expression when the range in air is already known.

$$Rs = \frac{3.2 \times 10^{-4} R A^{1/2}}{\rho} \quad \text{[Formula 2]}$$

A: Atomic weight of a solid substance
ρ: Density

The range of α particles in Si is shown by the following expression.

$$Rs = \frac{3.2 \times 10^{-4} \times (3.94667) \times (28.0855)^{\frac{1}{2}}}{2.33} \quad \text{[Formula 3]}$$
$$= 0.002873 \text{ cm}$$
$$= 0.0287 \text{ cm}$$
$$= 28.7 \text{ μm}$$

Therefore, when using a shielding material (shielding wall) of Si in order to separate from a circuit, it is allowed to set 29 μl or more.

Figure 8:
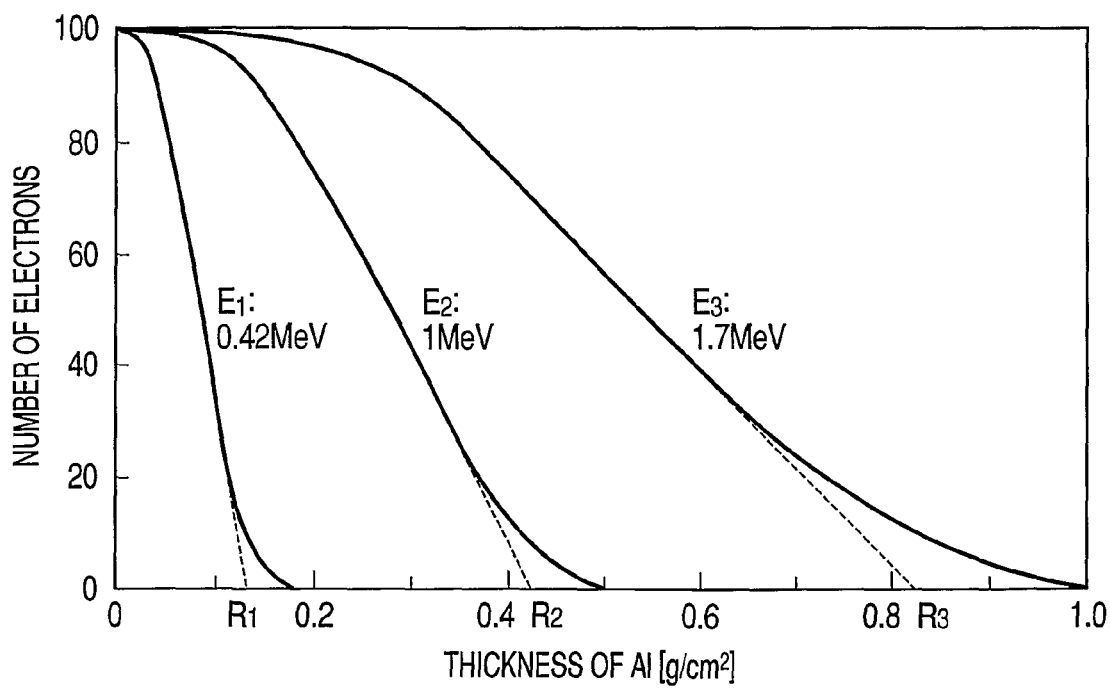
FIG. 8 is a graph showing decrease of the number of electrons due to increase of the thickness of aluminum.

Moreover, $^{210}$Pb-$^{210}$Po discharges very weak beta rays. In the case of the beta ray, the number of reached electrons is exponentially decreased with a distance as shown in FIG. 8 differently from α particles. A beta ray is an electron but it does not influence an internal IC circuit at all. However, it is necessary to use a structure from which beta rays do not leak to the outside so as not to be misunderstood. A necessary thickness of a shielding material is obtained from the following expression. In FIG. 8, the axis of abscissa denotes thickness of Al and the axis of ordinate denotes the number of electrons.

Because the maximum energy Em of the Pb-210 beta ray is 0.061 MeV, the maximum range Rm is calculated in accordance with the Willson's expression.

$$Rm = 2400(Em)^2 = 2400 \times (0.061)^2 = 2400 \times 0.003721 = 8.9304 \text{ mg/cm}^2$$

Moreover, from Isotope Handbook (Revised Third Edition, Maruzen, April, 1985), the range in Al is 6 mg/cm$^2$ at 60 KeV. Because the density of Al is 2.7 g/cm$^3$, the following expression is obtained.

$$Rm = \frac{8.9304 \text{ mg/cm}^2}{2700 \text{ mg/cm}^3} \quad \text{[Formula 4]}$$

$$= 3.308 \times 10^{-3} \text{ cm}$$

$$= 3.308 \times 10^{-2} \text{ mm}$$

$$= 0.03308 \text{ mm}$$

$$= 33 \text{ μm}$$

Thus, it is enough that the sealing material shown in FIG. 1 necessary for a RPG-RFID chip is 33 μm or more.

Figure 5A:
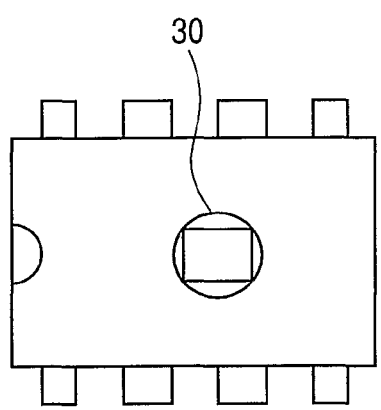
FIGS. 5A and 5B are illustrations showing a case of setting a pulse generation source to a DIP-type IC.
Figure 5B:
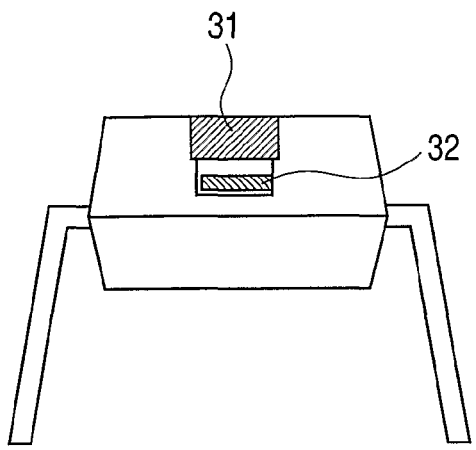

The present invention can be easily built in not only a RPG-RFID chip but also a general IC. FIGS. 5A and 5B show layouts when building the present invention in a DIP-type IC. It is unnecessary to set the position at which an α-particle emitter is built in to the center like FIGS. 5A and 5B but the position can be changed in accordance with a design of an IC circuit. (The same is also applied to an MM chip.) In the illustrations, reference numeral 30 denotes an α-particle emitter setting portion, 31 denotes a sealing cap or pitch, and 32 denotes a diode chip on which an α-particle emitter is dripped.

Figure 6:
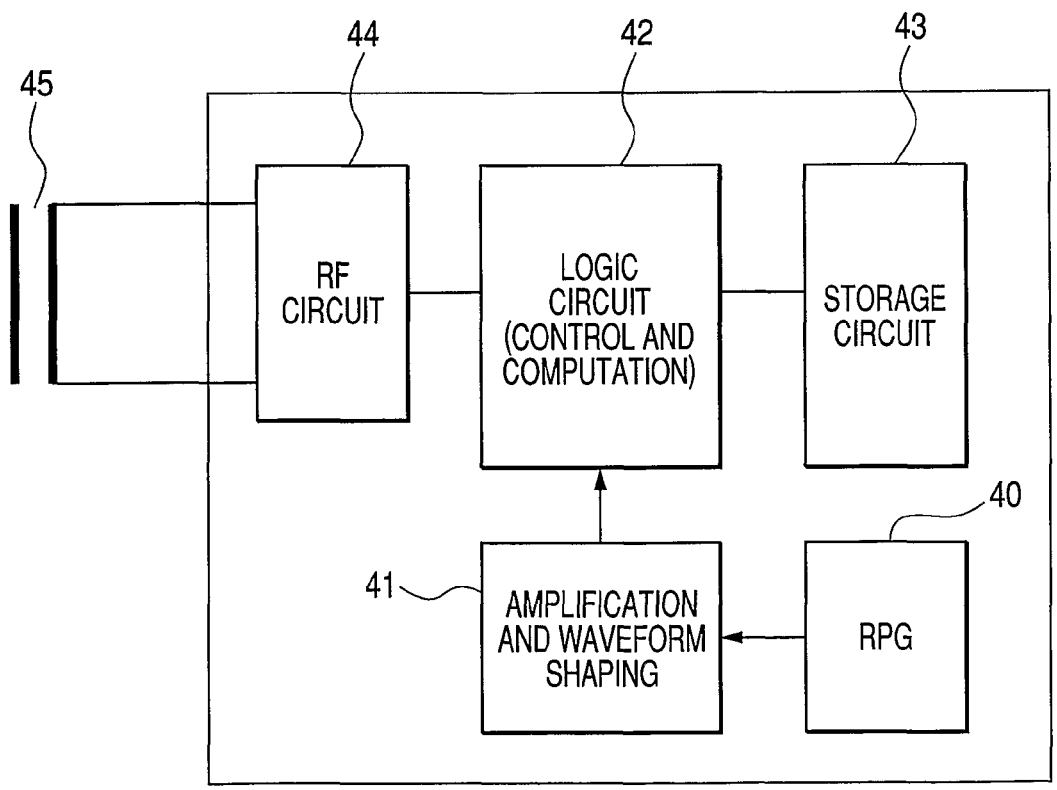
FIG. 6 is a block diagram showing a RPG-RFID of the present invention.

FIG. 6 shows the whole block circuit of a RPG-RFID chip of the present invention. The RPG-RFID chip is constituted of a waveform-shaping amplifying circuit 41, logic circuit (control processing) 42, storage circuit 43, RF circuit 44, and antenna 45.

The waveform-shaping amplifying circuit 41 is used to form a cusp waveform output from the RPG 40 into a shaped rectangular waveform which can be digital-processed. The logic circuit 42 is a processing circuit for handling a random pulse signal as a purposed signal. The storage circuit 43 is a circuit for storing data after signal processing. The RF circuit 44 is a circuit for performing communication with the outside through the antenna 45.

As shown in FIG. 9, to digitalize and store a signal from a RPG, the peak value and pulse interval of a random pulse of the RPG are random. Therefore, it is possible to measure the pulse interval or sample-hold the voltage of the peak value to digital-convert the voltage, and bring the measured or converted value into a random number. Moreover, it is possible to use a combination between voltage and the number of clock pulses.

Then, when using a pulse generated by the RPG as an authentication signal, the probability in which completely the same pulse interval occurs is obtained.

A case is obtained in which an average discharge rate n=10 of normally used pulses as an example.

[Formula 5]

$$P(t_1, t_2) = \frac{A \int_{t_1}^{t_2} e^{-nt} dt}{A \int_0^\infty e^{-nt} dt} = e^{-nt_1} - e^{-nt_2} \quad (1)$$

When the average discharge rate of the RPG is n=10, it is assumed to use an average number of pulses of 10 for 1 sec as an authentication signal.

TABLE 1

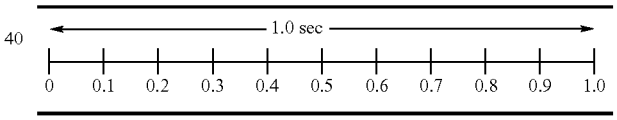

When it is assumed that 10 pulse intervals appear as an average pulse interval of 0.1 sec, the probability in which 10 pulses appear next time at the same time interval is shown by the calculation result of the following table.

TABLE 2

| | Average number of pulses | Average (sec) | t1 (sec) | t2 (sec) | $e^{-n*t1}$ | $e^{-n*t2}$ | P | 1/P | Total 1/P |
|---|---|---|---|---|---|---|---|---|---|
| 1 | 10 | 0.1 | 0 | 0.1 | 1 | 0.367879 | 0.632121 | 1.581977 | |
| 2 | 10 | 0.1 | 0.1 | 0.2 | 0.367879 | 0.135335 | 0.232544 | 4.300259 | 5.882235 |
| 3 | 10 | 0.1 | 0.2 | 0.3 | 0.135335 | 0.049787 | 0.085548 | 11.68931 | 68.7593 |
| 4 | 10 | 0.1 | 0.3 | 0.4 | 0.049787 | 6.018316 | 0.031471 | 31.77485 | 2184.817 |
| 5 | 10 | 0.1 | 0.4 | 0.5 | 0.018316 | 0.006738 | 0.011578 | 86.373 | 188709.2 |
| 6 | 10 | 0.1 | 0.5 | 0.6 | 0.006738 | 0.002479 | 0.004259 | 234.7862 | 44306299 |
| 7 | 10 | 0.1 | 0.6 | 0.7 | 0.002479 | 0.000912 | 0.001567 | 638.215 | 2.83E+10 |
| 8 | 10 | 0.1 | 0.7 | 0.8 | 0.000912 | 0.000335 | 0.000576 | 1734.848 | 4.91E+13 |
| 9 | 10 | 0.1 | 0.8 | 0.9 | 0.000335 | 0.000123 | 0.000212 | 4715.806 | 2.31E+17 |
| 10 | 10 | 0.1 | 0.9 | 1 | 0.000123 | 4.54E-05 | 7.8E-05 | 12818.89 | 2.97E+21 |

From the calculation results of the above table, the probability in which 10 pulse strings at the same interval appear is 1/2.97E+21.

Therefore, in the case of a method using this system, the probability in which at most 10 pulses realize the same combination is 1/2.97E+21 or less. This probability is a probability in the same pulse generator but an individual pulse generator respectively has different n value. Therefore, the probability in which different pulse generators have the same pulse string become $(1/3E+21)^2$ or less.

It is possible to select a pulse number to be used in accordance with the purpose of an IC using this system for authentication and improve the safety.

Then, a method for preparing uniform random numbers is described below.

The probability of pulses appearing at a time interval from $t_1$ to $t_2$ is obtained from the above expression (1).

When transforming the above expression, the following expression (2) is obtained.

$$t_2 = -1/n * \log(e^{-nt1} - P) \quad (2)$$

wherein $t_2 > t_1$, therefore the above expression is replaced with $t_k = t_2$, $t_{k-1} = t_1$, and $t_1, t_2, \ldots$ are successively obtained from $t_0 = 0$, and thereby, it is possible to obtain the threshold value of a time width ($\Delta t$) having $1/p$ ways of uniform appearance probabilities.

$$t_{k+1} = -1/n * \log(e^{-ntk} - p) \quad (3)$$

wherein, $t_0 = 0$

In the case of this expression (3), by fixing n and p, it is possible to univocally decide each $t_k$ value. When performing pulse time interval measurement by a 16-bit length (0-65535) and considering the effective number of digits after conversion, it is necessary to set the data length to be replaced with the above threshold value to approx. 8-bit length. Otherwise, it is impossible to ignore the influence of an error in a short time interval. Therefore, the above p is set to 256 and the interval of 0-65535 (16-bit length) is converted to the interval of 0-255 (8-bit length) by the above threshold value. When 16 bits are required as a bit length, it is possible to generate 16 bits by connecting two 8-bit-length data values.

In the case of this method, when the n value increases, the appearance time interval relatively decreases. When keeping a time interval measuring resolution constant, an error becomes a problem. However, when the n value decreases, a time interval relatively increases. When keeping the time interval measurement resolution constant, a rounding error (overflow) occurs in an upper value.

Therefore, fluctuating the basic cycle of time measurement is made to correspond to the fluctuation of n value. That is, when the measured n value is small, the basic cycle of measurement is increased, while when the n value is large, the basic cycle of measurement is decreased. Thereby, the distribution of value data as a measured result is always constant and, it is possible to simplify a subsequent arithmetic processing circuit. Moreover, because the fluctuation of the basic cycle of time measurement depends on only the average number of discharges for unit time, the fluctuation of the reference operation frequency of an arithmetic circuit is corrected in a scope which that the operation speed of the arithmetic circuit follows from the viewpoint of throughput. Therefore, the accuracy of the frequency of an oscillation circuit for generating clocks of the arithmetic circuit is not requested. Specifically, the following expression (4) is obtained.

$$t_{k+1} = -1/n * \log(e^{-ntk} - p) \quad (4)$$

wherein, $t_0 = 0$.

However, when assuming the fluctuation component of n as m and $n = n \times m$, the following expression (5) is obtained.

$$t_{k+1} = -1/nm * \log(e^{-nmtk} - p) \quad (5)$$

wherein, $t_0 = 0$.

In this case, by fluctuating the basic cycle of measured time in accordance with m ($tk = t1/m$), the following expression (6) is obtained.

$$t_{l+1} = -1/n * \log(e^{-nt1} - p) \quad (6)$$

wherein, $t_0 = 0$.

Therefore, a basic arithmetic expression can be directly applied.

When assuming the operation frequency used for the arithmetic circuit as approx. 25 MHz, the basic cycle clock is 40 ns. When assuming n value as 10, an average pulse interval is 100 ms. Measurement of the average pulse interval is made by assuming the measurement basic cycle as 100 μs. The number of divisions for generating the measurement basic cycle becomes 100 μs/40 ns = 2500 counts. Therefore, the minimum value (resolution) of the above fluctuation value m becomes 0.4/100 = 0.004(0.4%) and the resolution of the fluctuation of measured reference time to the fluctuation of n value does not matter.

The measurement time necessary to obtain 256 values in accordance with this system increases as n decreases. For example, the $255^{th}$ threshold value becomes 1.386 sec when n is equal to 4, 1.848 sec when n is equal to 3, and 2.773 sec when n is equal to 2. Therefore, it is necessary to continue counting up to this time. It is possible to round a time width more than that time in the maximum value (65535) of time measured data. (Even if rounding the time, the appearance frequency of the maximum data 255 does not greatly change.) Therefore, the maximum value of measurement is fluctuated due to n value.

Then, a method for preparing a probability is described below.

The probability using natural decay can be obtained by the following expression (1). The expression (1) can be shown by the following expression (7).

$$p = e^{-nt1} - e^{-nt2} \quad (7)$$

Therefore, it is only necessary to decide $t_1$ and $t_2$ for satisfying a probability value to be generated and judge whether a pulse is present between $t_1$ and $t_2$. In this case, when infinitely increasing $t_2$, $t_2$, $e^{-n12}$ at the second item can be ignored because it becomes 0 and it is possible to judge a hit by comparing a measured time width with $t_1$. By infinitely increasing $t_2$, a region in which the appearance frequency of $e^{-nt}$ is small is used. Therefore, it is possible to widely take a resolution. Therefore, it is possible to minimize a rounding error for probability calculation.

An expression when assuming that $t_2$ is infinite is shown by the following expression (8).

$$p = e^{-nt1} \quad (8)$$

When applying logarithm to the both sides of the expression (8) to obtain $t_1$, the following expression (9) is obtained.

$$t_1 = -\log(p)/n \quad (9)$$

Thus, the value of $t_1$ can be obtained from a set probability value (p) and the number of pulses (n) per sec.

Also in this case, necessary measurement time is fluctuated due to the fluctuation of n value. Particularly when a probability value is small, it is necessary to make long-time measurement effective. Therefore, by fluctuating the basic cycle of measurement similarly to the case of the computation of uniform random numbers, it is possible to solve the problem of overflow or insufficient accuracy of a counter. This method can correspond to a very small probability value. However, when a probability value is small, the maximum value of measurement increases and a case in which measurement time is lengthened occurs. However, by using a mechanism or structure for storing a past measured value in an arithmetic circuit, the problem of response time can be avoided.

It is only necessary to compute the expression (9) $t_1 = -\log(p)/n$ when a probability value is set from the outside, and a computation does not occur at the time of measurement. Therefore, the influence on actual operations is very small even if a computation time is required to a certain extent. To flexibly correspond to a set probability value and make it possible to select various probability values by external inputs, it is possible to compute the above logarithm operations by a microcomputer without using a table for omitting calculations.

Then, setting a reference measurement time in relative to n value for fluctuating a basic cycle is described below.

In the Expression $$p = e^{-nt_1} - e^{-nt_2} \tag{7}$$

wherein assuming $t_0$ as 0, the time interval of the maximum threshold value (255) can be obtained from the following expression (10) from $p=255/256=1-e^{-nt_{255}}$.

$$t_{255} = -(1/n)*\log(1/256) = 5.545177/n \tag{10}$$

When setting the above 255th threshold value+5% as the time at which a 16-bit timer overflows, by taking some allowance, the maximum time interval which can be counted by the 16-bit timer is shown by the following expression (11).

$$t_{max} = 5.545177*1.05/n = 5.822436/n \tag{11}$$

Thereby, the cycle of the counting reference clock of the timer becomes $$t_{clk} = (5.822436/65536)/n = 88.84333 \, \mu s/n.$$

When assuming the basic operation frequency of an arithmetic circuit as 25 MHz, the cycle of a system clock becomes $$t_{sys} = 40 \text{ ns}$$

and the value of a prescaler for generating a reference clock $t_{clk}$ of the above timer becomes $$t_{pres} = (88843.33/40.816)/n = 2176.7/n.$$

By fluctuating the counting reference cycle of the timer in accordance with the value of n, it is only necessary to use the expression (4) in order to obtain a threshold value for generating a uniform random numbers and the following expression is obtained.

$$t_{k+1} = -1/n*\log(e^{-ntk}-p); \text{ wherein } t_0=0$$

In the above expression, when calculating each $t_k$ when n is equal to 5.822436, threshold values from 1 to 255 can be calculated and they are shown in the table below.

TABLE 3

| Data | Threshold value |
|---|---|
| 0 | 0 |
| 1 | 44 |
| 2 | 88 |
| 3 | 133 |
| 4 | 177 |
| 5 | 222 |
| 6 | 267 |
| 7 | 312 |
| 8 | 357 |
| 9 | 403 |
| 10 | 448 |
| 11 | 494 |
| 12 | 540 |
| 13 | 587 |
| 14 | 633 |
| 15 | 680 |
| 16 | 726 |
| 17 | 773 |
| 18 | 821 |
| 19 | 868 |
| 20 | 916 |
| 21 | 963 |
| 22 | 1011 |
| 23 | 1060 |

TABLE 3-continued

| Data | Threshold value |
|---|---|
| 24 | 1108 |
| 25 | 1157 |
| 26 | 1205 |
| 27 | 1254 |
| 28 | 1304 |
| 29 | 1353 |
| 30 | 1403 |
| 31 | 1453 |
| 32 | 1503 |
| 33 | 1553 |
| 34 | 1604 |
| 35 | 1655 |
| 36 | 1706 |
| 37 | 1757 |
| 38 | 1809 |
| 39 | 1860 |
| 40 | 1912 |
| 41 | 1965 |
| 42 | 2017 |
| 43 | 2070 |
| 44 | 2123 |
| 45 | 2176 |
| 46 | 2229 |
| 47 | 2283 |
| 48 | 2337 |
| 49 | 2391 |
| 50 | 2446 |
| 51 | 2501 |
| 52 | 2556 |
| 53 | 2611 |
| 54 | 2667 |
| 55 | 2722 |
| 56 | 2779 |
| 57 | 2835 |
| 58 | 2892 |
| 59 | 2949 |
| 60 | 3006 |
| 61 | 3064 |
| 62 | 3121 |
| 63 | 3180 |
| 64 | 3238 |
| 65 | 3297 |
| 66 | 3356 |
| 67 | 3415 |
| 68 | 3475 |
| 69 | 3535 |
| 70 | 3595 |
| 71 | 3656 |
| 72 | 3717 |
| 73 | 3778 |
| 74 | 3840 |
| 75 | 3902 |
| 76 | 3964 |
| 77 | 4027 |
| 78 | 4090 |
| 79 | 4154 |
| 80 | 4217 |
| 81 | 4282 |
| 82 | 4346 |
| 83 | 4411 |
| 84 | 4476 |
| 85 | 4542 |
| 86 | 4608 |
| 87 | 4674 |
| 88 | 4741 |
| 89 | 4808 |
| 90 | 4876 |
| 91 | 4944 |
| 92 | 5012 |
| 93 | 5081 |
| 94 | 5150 |
| 95 | 5220 |
| 96 | 5290 |
| 97 | 5361 |
| 98 | 5432 |
| 99 | 5503 |
| 100 | 5575 |
| 101 | 5648 |

TABLE 3-continued

| Data | Threshold value |
|---|---|
| 102 | 5720 |
| 103 | 5794 |
| 104 | 5868 |
| 105 | 5942 |
| 106 | 6017 |
| 107 | 6092 |
| 108 | 6168 |
| 109 | 6244 |
| 110 | 6321 |
| 111 | 6398 |
| 112 | 6476 |
| 113 | 6555 |
| 114 | 6633 |
| 115 | 6713 |
| 116 | 6793 |
| 117 | 6874 |
| 118 | 6955 |
| 119 | 7037 |
| 120 | 7119 |
| 121 | 7202 |
| 122 | 7286 |
| 123 | 7370 |
| 124 | 7455 |
| 125 | 7541 |
| 126 | 7627 |
| 127 | 7714 |
| 128 | 7802 |
| 129 | 7890 |
| 130 | 7979 |
| 131 | 8069 |
| 132 | 8159 |
| 133 | 8250 |
| 134 | 8342 |
| 135 | 8435 |
| 136 | 8528 |
| 137 | 8622 |
| 138 | 8717 |
| 139 | 8813 |
| 140 | 8910 |
| 141 | 9007 |
| 142 | 9106 |
| 143 | 9205 |
| 144 | 9305 |
| 145 | 9406 |
| 146 | 9508 |
| 147 | 9610 |
| 148 | 9714 |
| 149 | 9819 |
| 150 | 9924 |
| 151 | 10031 |
| 152 | 10139 |
| 153 | 10248 |
| 154 | 10357 |
| 155 | 10468 |
| 156 | 10580 |
| 157 | 10693 |
| 158 | 10808 |
| 159 | 10923 |
| 160 | 11040 |
| 161 | 11158 |
| 162 | 11277 |
| 163 | 11397 |
| 164 | 11519 |
| 165 | 11642 |
| 166 | 11766 |
| 167 | 11892 |
| 168 | 12019 |
| 169 | 12148 |
| 170 | 12278 |
| 171 | 12410 |
| 172 | 12543 |
| 173 | 12678 |
| 174 | 12814 |
| 175 | 12952 |
| 176 | 13092 |
| 177 | 13234 |
| 178 | 13377 |
| 179 | 13522 |
| 180 | 13669 |
| 181 | 13818 |
| 182 | 13969 |
| 183 | 14123 |
| 184 | 14278 |
| 185 | 14435 |
| 186 | 14595 |
| 187 | 14757 |
| 188 | 14921 |
| 189 | 15088 |
| 190 | 15257 |
| 191 | 15429 |
| 192 | 15604 |
| 193 | 15781 |
| 194 | 15961 |
| 195 | 16144 |
| 196 | 16330 |
| 197 | 16519 |
| 198 | 16712 |
| 199 | 16907 |
| 200 | 17107 |
| 201 | 17309 |
| 202 | 17516 |
| 203 | 17726 |
| 204 | 17941 |
| 205 | 18159 |
| 206 | 18382 |
| 207 | 18610 |
| 208 | 18842 |
| 209 | 19079 |
| 210 | 19321 |
| 211 | 19568 |
| 212 | 19821 |
| 213 | 20080 |
| 214 | 20345 |
| 215 | 20616 |
| 216 | 20894 |
| 217 | 21179 |
| 218 | 21471 |
| 219 | 21771 |
| 220 | 22080 |
| 221 | 22397 |
| 222 | 22723 |
| 223 | 23059 |
| 224 | 23405 |
| 225 | 23763 |
| 226 | 24132 |
| 227 | 24513 |
| 228 | 24908 |
| 229 | 25318 |
| 230 | 25742 |
| 231 | 26184 |
| 232 | 26643 |
| 233 | 27122 |
| 234 | 27623 |
| 235 | 28146 |
| 236 | 28696 |
| 237 | 29273 |
| 238 | 29881 |
| 239 | 30525 |
| 240 | 31207 |
| 241 | 31934 |
| 242 | 32710 |
| 243 | 33544 |
| 244 | 34445 |
| 245 | 35425 |
| 246 | 36497 |
| 247 | 37683 |
| 248 | 39009 |
| 249 | 40512 |
| 250 | 42247 |
| 251 | 44299 |
| 252 | 46811 |
| 253 | 50049 |
| 254 | 54613 |
| 255 | 62414 |

When obtaining that measured data is included between any threshold values, the result becomes an 8-bit uniform random number.

A method for obtaining that measured data is included between any threshold values includes two types of methods. One is a method for performing magnitude comparison by binary search after measurement is completed and the other is a method for checking a present measured value is included in any area in the course of measurement. Each of the methods is described below.

Binary Search Method

In the case of the present conversion, condition for binary search is perfect because measured data becomes 16-bit length and converted data becomes 8-bit length, so a program can be greatly simplified. A sample of algorithms specified under this condition is shown below.

BitInd I Cator=10000000b;
Result=BitInd I Cator;
Repeat
If MeasuredValue<DataTable(Result) then Result=Result xor BitInd I Cator;
BitInd I Cator=RightLotate(BitInd I Cator, 1 bit);
Result=Result xor BitInd I Cator;
Until BitInd I Cator. bit7="1";

In the case of this conversion, comparison of 16-bit length, bit processing(xor), and reference of a data table are performed eight times.

Judgment in Measurement Course

In the above threshold value table, a numerical value increases in order of 0 to 255. Therefore, by performing comparison with data table whenever measuring a pulse interval, processing is greatly simplified. Further, since conversion into uniform random number is completed when measurement is completed (or the next pulse arrives), response is also greatly improved. Therefore, a certain determined time is not required to arithmetic processing, unlike the above method using binary search. When using a microcomputer for arithmetic processing, the algorithm may effectively work. Specific algorithm is shown below.

In the case of this method, it is assumed that data for 1 to 255 in the above table is stored in 0 to 254.

<Initial Processing>
Result=0; Head of table
<For Every Prescaler Overflow>
if MeasuredValue=DataTable(Result) then Result=Result+1;

Therefore, because this is a very simple method and threshold value searches are performed dispersedly, a load for the throughput (processing capacity) of the arithmetic processing portion is vary small.

Then, a processing procedure of a device/method for generating a random number and probability of the present invention is described below more minutely.

The method to be described below has three modes such as normal (stand alone) mode, demonstration mode, and multi-module mode (multimode) and the following features.

The normal mode is a mode to be connected with a host computer one to one, which outputs exponential distribution random number string and uniform random number string and outputs a probability judgment result in accordance with input of a probability judgment read command. The demonstration mode is a mode prepared for demonstration, which outputs an exponential distribution random number string, uniform distribution random number string, and probability judgment result, for each measurement of pulses. The multimode can connect a plurality of modules, increase a random number generation speed, in which an exponential distribution random number string, uniform distribution random number string, and probability judgment result are respectively output in accordance with a command.

Figure 10A:
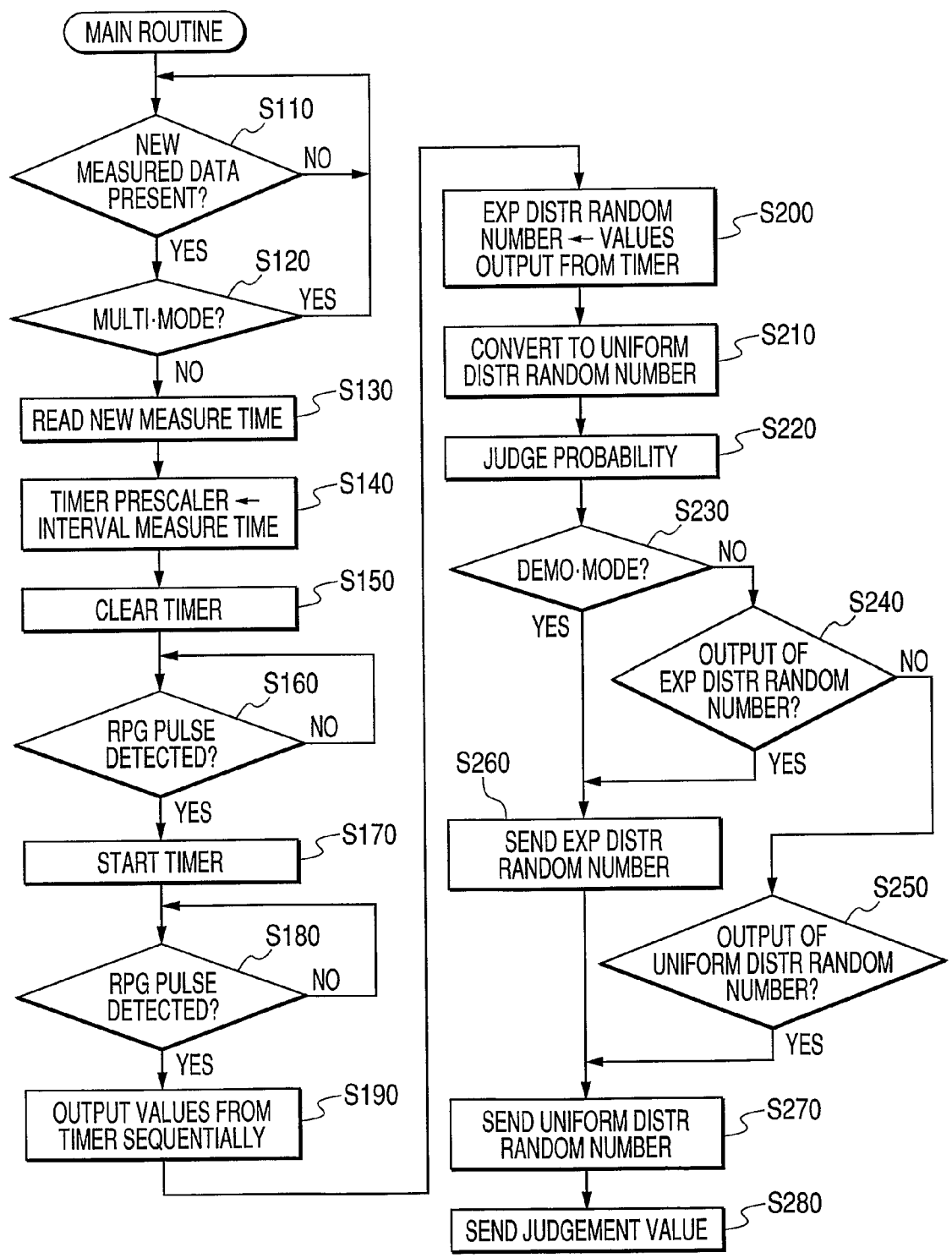
FIGS. 10A, 10B and 10C are flowcharts showing parts of an operation of an embodiment according to the present invention.
Figure 10B:
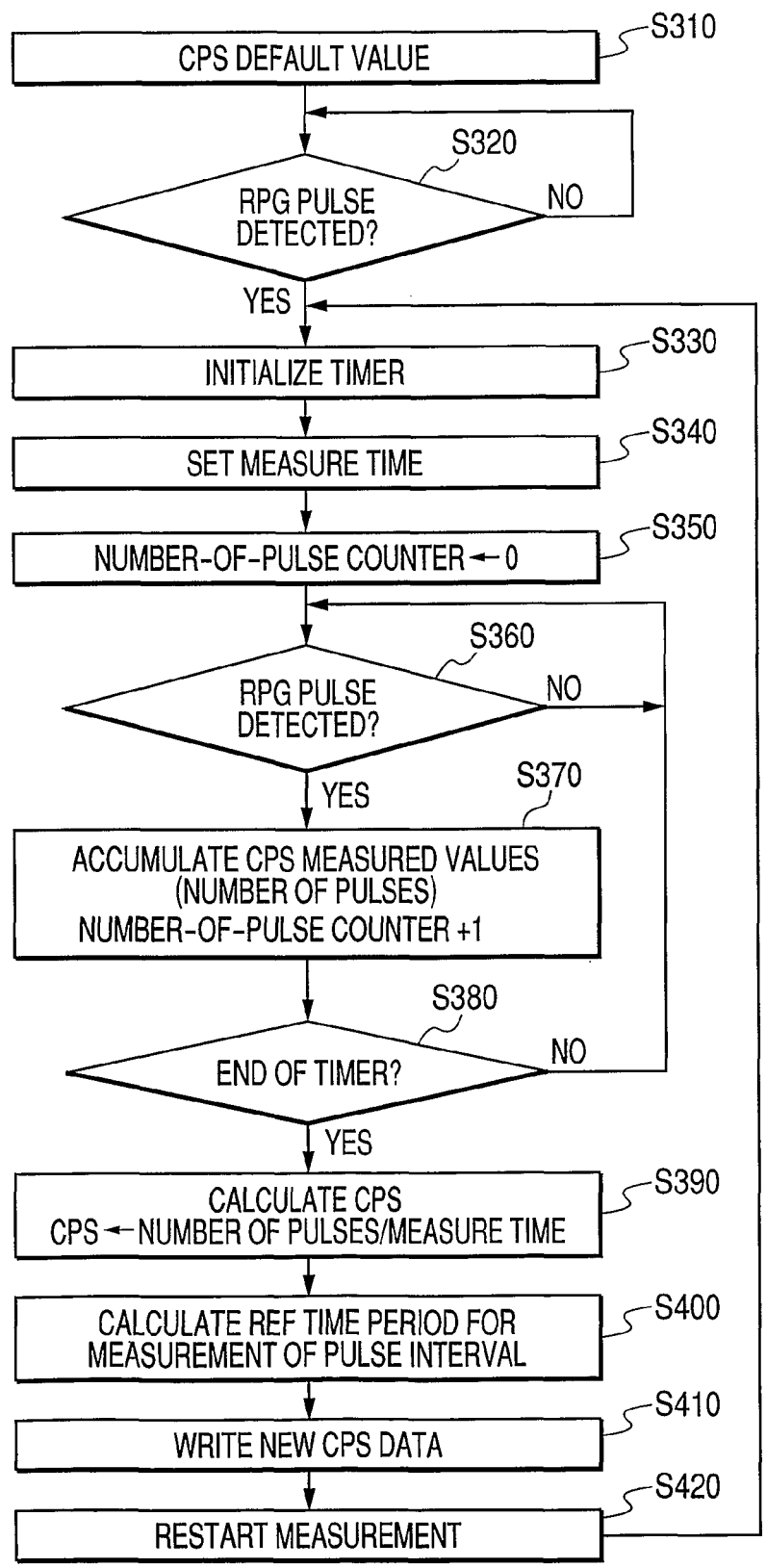
Figure 10C:
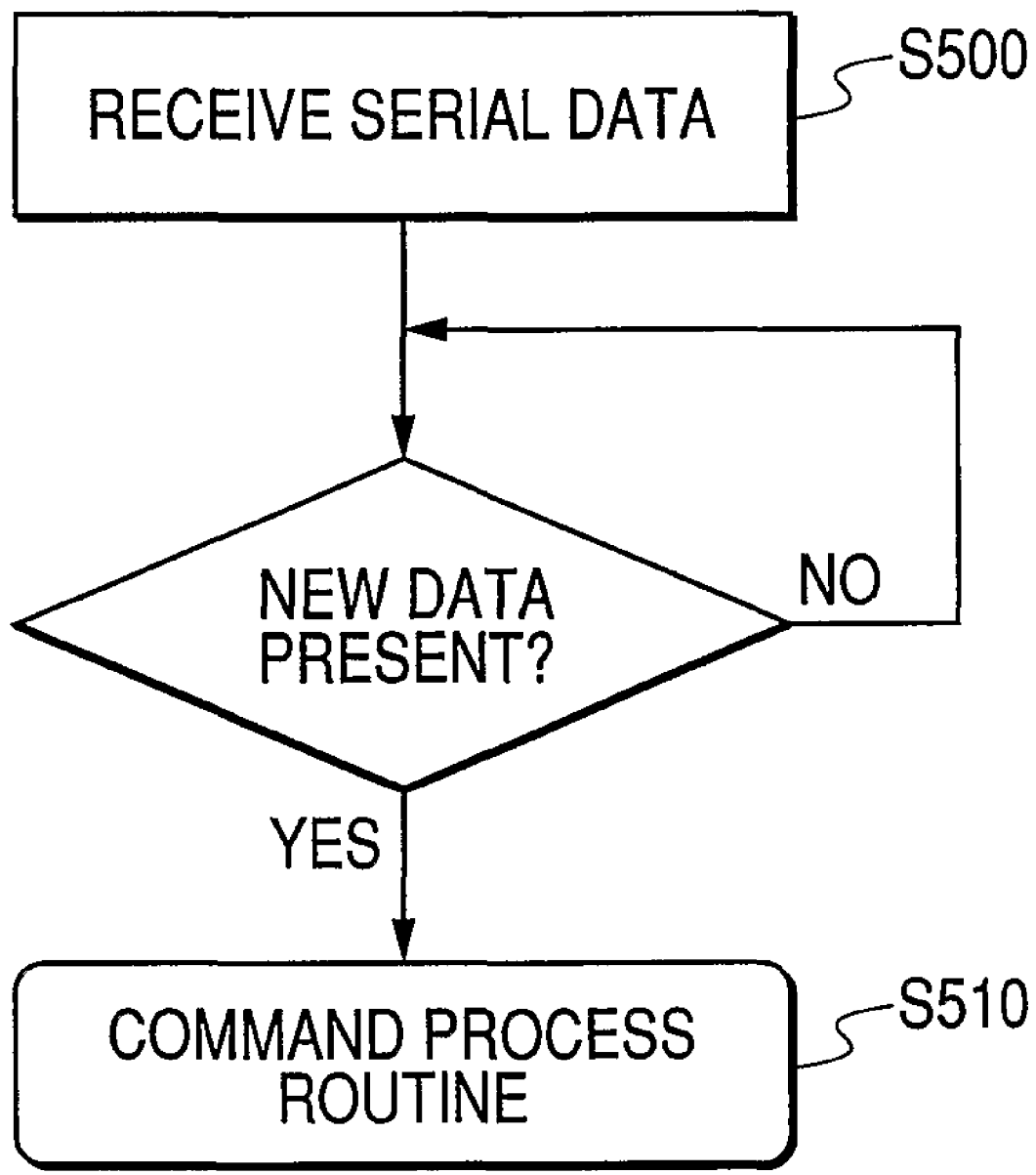

FIGS. 10A to 10C are flowcharts showing algorithm when processing a device/method of the present invention by using a microcomputer.

First, as shown in FIG. 10A, initializing operations such as clearing of a RAM, initialization of various registers, and reading of the default value of a flash memory are performed and the main routine is started.

In the main routine, it is checked whether unprocessed new measured time data is present (step S110). When the data is present, the data is called (read) (step S130) by premising that the present mode is not the multimode (step S120). Then, a prescaler of a timer for measuring an inter-pulse time (pulse time interval, pulse interval) is set (step S140) and the timer is cleared (step S150). When a RPG pulse is detected (step S160), the timer is started (step S170). Every time the RPG pulse is detected (step S180), the timer outputs measured data (step S190) and the data is stored as exponential random number (step S200). Then, the data is converted into a uniform distribution random number (step S210) to judge a probability (hit or failure) (step S220). Then, it is judged whether an operation mode is the demonstration mode (step S230). When the operation mode is the demonstration mode, an exponential distribution random number is transmitted to the host computer without condition (independently of presence or absence of selection of random number output) (step S260), a uniform distribution random number is transmitted (step S270), and moreover a probability judgment value is transmitted (step S280).

When the operation mode is not the demonstration mode (that is, the normal mode), an exponential distribution random number is transmitted when the output of the random number is selected (step S240) and when the output of the uniform distribution random number is selected (step S250).

On the other hand, as shown in FIG. 10B, for measurement of CPS values (number of pulses), the default value is set (step S310), and when RPG pulse is detected (step S320), a timer for setting a measurement time is initialized (step S330) to set the measurement time (step S340). Then, a number-of-pulse counter is cleared (step S350), and every time the RPG pulse is detected (step S360), the measured values are integrated (step S370). This is repeated up to a set measured time (e.g. 64 seconds or 1 hour). When the measurement set time comes (step S380), the CPS value of the set measured time is calculated (step S390). Then, a reference time period for measurement of pulse interval is calculated (step S400), and new CPS data is written in a flash memory (step S410) to start measurement (step S420).

The measurement processes shown in FIGS. 10A and 10B are conducted in parallel and simultaneously, and the measurement of pulse interval is conducted over the whole pulse period.

In the present embodiment, as shown in FIG. 10C, when receiving serial data (step S500), a command processing routine is started only when there is new data (step S510).

Processing of an operation condition setting command, processing of an internal status reading command, processing of a probability setting command, processing of an operation command, and comparison between a module address and a designated address are performed so that the command processing routine describes data in a program describing a processing procedure (algorithm) to be described later.

The program shown below describes a processing algorithm in a microcomputer when processing a device for generating a uniform random number and probability of the present invention by using a microcomputer.

ALGORITHM IN MICROCOMPUTER

Micro Computer: C8051F330
Operational Frequency: 24.5 MHz
System Clock: 1/1

1. Allocation of ports and Interrupt functions
    P0.0: Input of pulses
    P0.4: Serial output
    P0.5: Serial input
    P1.3: LED output External interrupt0 : Detect input of pulse
    Timer1 : Generate transfer rate of UART
    Timer2 : Used for inter-pulse time measurement
    : Prescaler value is changed by CPS
    Timer3 : Used for creating constant time (CPS measuring time)
    Serial interrupt : Used for data reception 2. Timers
    Timer0 : Not used
    Timer1 : Baud Rate Generator of RS232C
    Timer1 Condition {
        Pre-scale = 1/1
        8 bit Reload Mode
        Reload Value = 96h
    }
    Timer2 Prescaler for pulse counting
    Timer2 Condition {
        16 bit Reload Mode
        Pre-scale = 1/1
        Reload Value = tpres
    }
    Timer3 Timer for CPS counting
    Timer3 Condition {
        16 bit Reload Mode
        Pre-scale = 1/12
        Reload Value = 40833 ; Overflow = 20 mS
    }
    PCA Watch Dog Timer 3. Memories
    SerialBuffer(0..15) as M[8]; Serial receive buffer
    IntervalTime(0..3) as M[17]; Pulse Measurement time internal storage buffer
    SerialWPointer as M[8]; Pointer for indicating writing position when serially received data is written into receive buffer in interrupt processing routine.
    SerialRPointer as M[8]; Pointer for indicating position of next serial data to be processed within serial receive buffer in main routine
    IntervalWPointer as M[8]; Pointer for indicating position where next pulse measurement time is written in interrupt processing routine
    IntervalRPointer as M[8]; Pointer for indicating position in buffer for next pulse measurement time to be processed in main routine IntervalCounter as M[17]; Counter for counting pulse time interval in interrupt processing routine
CPSSecCounter as M[8]; Count for one second (25 times * 20 mS)
CPSTimeCounter as M[8]; Count for 64 seconds
CPSCounter as M[16]; CPS counter
CPS as M[16]; CPS value.
Prob(0..7) as M[16];         Probability set value
PValue(0..7) as M[16];       Threshold value after logarithmic calculation
PSetting as M[16];           Probability setting input value
PArg as M[8];                Probability setting argument
BEXP as M[8];                Index portion of value to be operated at
        ;                    logarithmic calculation
CycleCounter as M[8];        Used in operating portion, Counter for repeat
        ;                    number of times
BitIndicator as M[8];        Used for division calculation
NOPTimeCount as M[8];        Counter for number of pulses for each hour
RandomEXP as M[24];          Final result of exponential distribution random
        ;                    number
UniformedData as M[8];       Final result of uniform distribution random number
CPSForceData as M[16];       CPS forcible value
CPSMeasureTime as M[8];      Set value of CPS measurement time
NumberOfPulse as M[24];      Number of pulses for each hour
CPSReadOut as M[16];         Memory area of C P S measured value
        ;                    taken over from interrupt to main
CPSACTimeCount as M[8];      Count of CPS accumulation number of
        ;                    times
CPSAccumulation as M[24];    C P S measured time read-out
        ;                    accumulation buffer
        ;                    Accumulate measured times for 64 seconds
        ;                    till set measurement time is reached.
LastCPSAccumulation as M[24]; Past memory for C P S measured time
NOPCountBuffer as M[24];     Buffer for measurement of number of pulses
        ;                    for one hour
NumberOfNewData as M[8];     Number of received serial data not
        ;                    processed yet Bit area InternalFlag as M[8] = {
        CPSDetected as M[1]      ; CPS count-end flag
        LogASignMinus as M[1]    ; Sign of  Log(A)
        CountRestartF as M[1]    ; Restart counting
        DataFlip as M[1]         ; Uniform random number turn-back
        NOPCaptureF as M[1]      ; End of measurement for one hour
        SerialReceived as M[1]   ; Serial reception flag
        CPSForceF as M[1]        ; bit7 : C P S forcible setting
}

OperationMode as M[8] = {        ; Operation mode
        UniformDataOutF as M[1]          ; Output of uniform distribution

```
            EXPDataOutF as M[1]           ; random number
                                          ; Output of exponential
                                          ; distribution random number
            DemoModeF as M[1]             ; Demo mode
            MultiModeF as M[1]            ; Multi mode
}

StatusFlag as M[8] = {                    ; Error status
            CPSTooLittleF as M[1]         ; No detection of C P S
            CPSTooManyF as M[1]           ; Excessive detection of C P S
            IntervalTimeOF as M[1]        ; Overflow of measured value
            SerialBufferOF as M[1]        ; Overflow of serial buffer
}

ProbFlag as M[8] = {                      ; Probability judge (hit/failure)
            PJudge0 as M[1]               ; Judgment of probability number0
            PJudge1 as M[1]               ; Judgment of probability number1
            PJudge2 as M[1]               ; Judgment of probability number2
            PJudge3 as M[1]               ; Judgment of probability number3
            PJudge4 as M[1]               ; Judgment of probability number4
            PJudge5 as M[1]               ; Judgment of probability number5
            PJudge6 as M[1]               ; Judgment of probability number6
            PJudge7 as M[1]               ; Judgment of probability number7
}

InternalFlag1 as M[8] = {                 ; Internal flag

AddressExist as M[1]          ; Address is present in multi mode.
            AddressSelected as M[1]       ; When address is selected in multi mode
}

; Constants

CPSMAX as #100*64       / not less than 100 pulses for one second
            CPSMIN as #1*64         / not greater than one pulse for one second
            ConstEXPData as #01h
            ConstUniformedData as #02h
            ConstSecCount as #50
            ConstTimeCount as #64
            ConstNOPCount as #56
            SAck as #05h
            SNak as #50h
            ConstSPFilter as #10101111b
            ConstITFilter as #11001111b 4. Initial processing / Initial processing /
R0 = 00h;   Clear RAM.
Repeat
```

```
            RAM(R0) = 00h
            R0 += 1
until R0=0;
SerialWPointer = #SerialBuffer;    Set head address of buffer.
SerialRPointer = #SerialBuffer;
IntervalWPointer = #IntervalTime;   Set head address of buffer.
IntervalRPointer = #IntervalTime;
NOPTimeCount = #ConstNOPCount;
InitializeSFR;   Set 8051 SFR
LoadFlashData;   Read data from flash portion. Default value is read at the first time.
CalcTPreScaler;   Compute and set prescale value of Timer2.
CountRestart;   Initialize memory for restart of measurement and approve interrupt.
jump to Main;

/ InitializeSFR /
p0.4 = OutputMode;
P1.3 = OutputMode;
Timer1 = Timer1Condition;
Timer2 = Timer2Condition;
Timer3 = Timer3Condition;
PCA = PCACondition;
Timer2INTEnable = true;
Timer3INTEnable = true;

/ LoadFlashData /          ; Read data from flash memory.
                           ; Previously write default value in data portion of flash
                           ; memory.
CPS = FlashCPS;
CPSMeasureTime = FlashCPSMT;
NumberOfPulse = FlashNofP;
StatusFlag = FlashStatus;
OperationMode = FlashOPMode;
LastCPSAccumulation = FlashLastCPSAccumulation;
PROB(o..7) = FlashPROB(0..7);
Pvalue(0..7) = FlashPT(0..7);

5. Main routine

ConstEXPData as "01h";
ConstUniformedData as "02h";

repeat
        if IntervalWPointer<>IntervalRPointer then /Is there unprocessed new
                                                  /measured time data?
                if not(MultiModeF) then  /Processing is not performed in multimode.
                        ReadIntervalTime;  /Read new measured time.
                        ConvertToUniform;  /Conversion to uniform random number
                        CalcProb;  /Judgment of probability (hit/failure)
                        if DemoMode
                        then   /Unconditional transmission during demonstration
                               /mode
```

```
                            SendRandomEXP;    /Transmission of exponential
                                              /distribution random number
                            SendRandomUniform;  /Transmission of uniform
                                                /distribution random
                                                /number
                            SendPJudge;   /Transmission of probability
                                          /judgment value
                    else  /Transmission only when random number output is
                          /selected in normal mode.
                            if EXPDataOutF then SendRAndomEXP;
                            if UniformDataOutF then SendRAndomUniform;
                    endif
            endif
        endif
        if CPSDetected then
            CPSDetected = false;    /Processing when measurement (64 sec) of CPS
                                    /value is completed
            AccumulateCPS;    /Accumulate CPS values for 64 sec up to measured
                              /time set value.
            CPSACTimeCount -= 1;
            if CPSACTimeCount=0 then /When measurement set time is reached
                CalcCPS;   /Convert CPS value into average value for 16 sec.
                if not(CPSForceF) then CalcTPeScaler; /Calculation of
                                                      /prescaler value
                WriteToFlash;    /Write new CPS data in flash memory.
                CountRestart;    /Restart of measurement
            endif;
        endif
        if NumberOfNewData<>0 then CommandHandling;    /Reception of serial data
                /   Start command processing routine only when there is new data.
        endif
until forever;

6. Interrupt processing routine

/ External interrupt (INT0): Pulse input interrupt(p0) and Rising edge detection / if CountRestartF
then
        CountRestartF = false;   /Only start measurement timer at restart of
                                 /measurement.
        Start Timer2;
else
        IntervalTime(IntervalWPointer) = IntervalCounter;
        /Write measured result in measured data buffer.
        IntervalWPointer = (IntervalWPointer+1) and #ConstITFiler;
        / Update of pointer
        if IntervalWPointer=IntervalRPointer then IntervalTimeOF=true;
        / Buffer overflow check
        IntervalCounter = 0;
        CPSCounter +=1;   /Counting-up of CPS counter
``` endif
Return from Int;

/ Serial interrupt /
if SerialReceiveINTF then  /Perform processing only at the time of reception interrupt.
                           /Ignore transmission interrupt.
    SerialReceiveINTF = false;
    SerialBuffer(SerialInputPointer) = SerialReceivedData;
    / Write serial reception data in receiving buffer.
    SerialWPointer = (SerialWPointer+1) and #ConstSPFilter;
    /  Update of serial write pointer
    NumberOfNewData += 1;
    if NumberOfNewData>=32 then SerialBufferOF=true;
    / Buffer overflow check
endif
Return from Int;

/ Timer2 interrupt /

IntervalCounter +=1;   /Counting-up of inter-pulse time measuring counter
Return from Int;

/ Timer3 interrupt /
CPSSecCounter -= 1;   /Counting for 1 sec
if CPSSecCounter = 0
then
    CPSSecCounter = #ConstSecCount;
    CPSTimeCounter -= 1;   /Counting for 64 sec
    if CPSTimeCounter=0
    then
        CPSTimeCounter = #ConstTimeCount;
        CPSReadOut = CPSCounter;
          /Because 64 sec elapse, read CPS counted value.
        CPSCounter=0;
        CPSDetected = true;
        /  Set CPS detection flag.
    end if
endif
Return form Int 7. Subroutine / CountRestart /   Restart inter-pulse time measurement.
/   Initial state when CPS is updated and data is written in flash memory
CPSSecCounter = #ConstSecCounter;
CPSTimeCounter = #ConstTimeCount;
CPSACTimeCount = CPSMeasureTime;
CPSCounter = 0;
CPSAccumulation = 0;
IntervalCounter = 0;
CountRestartF = true;

CPSDetected = false;

/ ReadIntervalTime /   Read measured time from buffer of time measurement value.
RandomEXP = IntervalTime(IntervalRPointer);
IntervalReadPointer = (IntervalReadPointer+4) and #ConstITFilter;

/ AccumulateCPS /   Accumulate CPS measured values.
/   Accumulate measured values for 64 sec to obtain CPS value of set measured time.
/   Also obtain CPS measured value for every hour here.
/   Measured value for every hour is obtained by accumulating measured value for every
/   64 sec, 56 times and obtaining accumulated value for 3,584 sec, dividing next
/   measured value for 64 sec by 4, and adding it. (3584+64*0.25)=3600
CPSAccumulation = CPSAccumulation + CPSReadOut;
/   Accumulation of CPS values and accumulation of pulse numbers for one hour from here
if NOPCaptureF then CPSReadOut = CPSReadOut/4;
NOPCountBuffer = NOPCountBuffer + CPSReadOut;
if NOPCaptureF
then  /  Completion of measurement for one hour
        NumberOfPulse = NOPCountBuffer;
        NOPCaptureF = false;
        if DemoModeF then SendNOP;
        WriteToFlash;
        CountRestart;
else
        NOPTimeCount -= 1;
        if NOPTimeCount=0 then
                NOPCaptureF = true;
                NOPTimeCount = #ConstNOPCount;
        endif
endif / CalcCPS /     Calculation of CPS values for 64 sec
CPSAccumulation = (CPSAccumulation + LastCPSAccumulation) / 2;
LastCPSAccumulation = CPSAccumulation;
Breg = CPSMeasureTime;
if Breg.bit0<>"1" then
        repeat
                CPSAccumulation = CPSAccumulation/2;
                RightShift(b, 1bit);
        until Breg.bit0="1";
endif;
CheckCPSMAXMIN;   Checking of maximum and minimum CPS values
if not(CPSTooLittleF or CPSTooManyF) then CPS = CPSAccumulation;
if DemoModeF then SendCPS;
WriteToFlash:
CountRestart;

/ CheckCPSMAXMIN /
/   Check if CPS value exceeds specified range
/   When CPS value is too large, pay attention to it because interrupt cycle of Timer 2

/ becomes very short, interrupt is always applied and processing does not turn over.
Breg = #0;
If CPSAccumulation >= #CPSMAX then Breg.bit1 = "1";
If CPSAccumulation < #CPSMIN then Breg.bit0 = "1";
if StatusFlag<>Breg then
    StatusFlag = Breg;
    SendStatus;
endif;

/ SendRandomEXP /   Serial output of exponential distribution random number
SerialOutput = #ConstEXPData;
if RandomEXP[23..16]="0"
then
    SerialOutput = RandonEXP;
else
    SerialOutput = #FFFFh;
endif / SendRandomUniform /   Serial output of uniform distribution random number
SerialOutput = #ConstUniformData;
SerialOutput = UniformedData;

/ SendCPS /   Serial output of CPS value
/   When internal status is read, and when CPS value is changed in demo mode
SerialOutput = #11h;
SerialOutput = CPS;

/ SendCPSMT /   Serial output of CPS measured time
/   When internal status is read
SerialOutput = #12h;
SerialOutput = CPSMeasureTime;

/ SendNOP /   Serial output of pulse number for one hour
/   When internal status is read, and when CPS values for one hour are changed
/   in demo mode
SerialOutput = #13h;
SerialOutput = NumberOfPulse;

/ SendStatus /   Serial output of status information
/   When internal status (CPS error) is changed, and when internal status is read
SerialOutput = #14h;
SerialOutput = StatusFlag;

/ SendVersion /   Serial output of version information
/   When internal status is read
SerialOutput = #15h;
i = 0;
repeat
    SerialOutput = FlashVer(i);
    i += 1;
until FlashVer(i)="FFh";

/ SendProbSetting /   Serial output of probability set value
/   When internal status is read
SerialOutput = SerialCommand;
SerialOutput = PROB(Command and "FFh");

/ SendPJudge /   Serial output of probability judgment value
/   When probability read command is received, and when internal status read
/   command is received for every pulse input in demo mode
SerialOutput = #28h;
SerialOutput = ProbFlag;

/ CalcProb /   Judge hit/failure from exponential distribution random number
i = 0;
ProbFlag = "0";
repeat
    if PValue(i)<=RandomEXP then ProbFlag[bit i] = "1";
    i += 1;
until i="8";

/ CommandHandling /.   Processing of serial command
if (SerialBuffer(SerialRPointer) and "F0h") = "00h" then    / Operation condition
                                                                                                / setting command
    if SerialBuffer(SerialRPointer) = "00h" then
      / When receiving unassigned code, return NAK.
        SendNAK;
        exit;
    endif
    if SerialBuffer(SerialRPointer) = "01h" then    /Forcible setting of CPS value?
        if NumberOfNewData<3 then exit;
        / When operand (set data) is not received, do nothing.
        RenewSRP;
        if (MultiModeF and AddressExist and not(AddressSelected)
        then
        /   When addresses do not coincide with each other in multimode,
        /   ignore command.
            RenewSRP;
            SendNal;
            exit
        else
            RenewSRP;
            CPSForceData = SerialBuffer(SerialRPointer);
            /   Read CPS forcible value.
            CPSForceF = true;
            /   Set CPS forcible flag.
            CalcTPrescaler;
            /   Calculate prescaler value (forcible data).
            RenewSRP;
            SendAck;
    endif
    if SerialBuffer(SerialRPointer) = "02h" then    /Cancel of CPS forcible setting
        if (MultiModeF and AddressExist and not(AddressSelected)
        then

```
        / When addresses do not coincide with each other in multimode,
        / ignore command.
                SendAck;
                exit
        else
                CPSForceF = false;
                / Reset CPS forcible flag.
                SendAck;
                exit
endif
if SerialBuffer(SerialRPointer) = "03h" then   /   Set CPS measurment time
        if NumberOfNewData<2 then exit;
        / When operand (set data) is not received, do nothing.
        RenewSRP;
        if (MultiModeF and AddressExist and not(AddressSelected)
        then
        / When addresses do not coincide with each other in multimode,
        / ignore command
                SendAck;
                exit
        else
        / Read and set CSP measurement time
                CPSMeasureTime = SerialBuffer(SerialRPointer);
                WriteToFlash;
                CountRestart;
                SendAck;
                exit
endif
if SerialBuffer(SerialRPointer) = "0Fh" /   Self-destruction
then
        if NumberOfNewData<5 then exit;
        / When operand (set data) is not received, do nothing.
        if (MultiModeF and AddressExist and not(AddressSelected)
        then
        / When addresses do not coincide with each other in multimode,
        / ignore command
                SerialRPointer += 4;
                NumberOfNewData -=4;
                RenewSRP;
                exit
        else
                RenewSRP;
                If SerialBuffer(SerialRPointer)="86h,51h,29h,78h"
                then
                / When normal data string is received, delete flash data.
                        Destroy;
                        exit;
                else
                / When normal data string is not received, ignore command
                / and return Nak.
                        SerialRPointer += 3;
                        NumberOfNewData -=3;
```

```
                            SendNAk;
                            exit
                    endif;
            endif
    else
            SendNAK;
            exit;
    endif
endif
if (SerialBuffer(SerialRPointer) and "F0h") = "10h" then    /  Read internal status
        if SerialBuffer(SerialRPointer)=("10h" or "16h" or "17h") then
        /  In the case of invalid data, return Nak.
                SendNak;
                exit;
        endif;
        ACC = SerialBuffer(SerialRPointer
        Sirent;
        if (not(MultiModeF) or (AddressExist and AddressSelected))
        then
        /  When in stand alone mode, and when addresses coincide with each other in
        /  multimode
                if ACC="11h" then    /Return CPS.
                        SendCPS;
                        exit;
                endif;
                if ACC="12h" then    /Return CSP measurement time.
                        SendCPSMT;
                        exit;
                endif;
                if ACC="13h" then    /Return CPS values for one hour.
                        SendNOP;
                        exit;
                endif;
                if ACC="14h" then    /Return status data.
                        SendStatus;
                        exit;
                endif;
                if ACC="15h" then    /Return version.
                        SendVersion;
                        exit;
                endif;
                SendProbSetting;    /Return probability set value.
                exit;
        else
                exit;
        endif
endif
if (SerialBuffer(SerialRPointer) and "F0h") = "20h" then    /Probability set command
        if SerialBuffer(SerialRPointer)="28h" then
        /  Read probability judgment value.
                if (not(MultiModeF) or (AddressExist and AddressSelected)) then SendPJudge;
                /Return probability judgment value only when in stand alone mode or
```

```
                /when addresses coincide with each other in multimode.
                Sirent;
                exit;
        endif
        if SerialBuffer(SerialRPointer)<"28h" then
                if NumberOfNewData<3 then exit;
                /   When operand (set data) is not received, do nothing.
                if (MultiModeF and AddressExist and not(AddressSelected)
                then
                /   When addresses do not coincide with each other in multimode,
                /   ignore command
                        SerialRPointer += 2;
                        NumberOfNewData -=2;
                        Sirent;
                        exit;
                else
                /   Set probability set value.
                        PArg = SerialBuffer(SerialRPointer) and "00000111b";
                        /   Calculate probability number.
                        RenewSRP;
                        PROB(PArg) = SerialBuffer(SerialRPointer);
                        /   Write probability set value.
                        RenewSRP;
                        CalcPThreshold;
                        /   Calculate probability judgment threshold.
                        WriteToFlash;
                        SendAck;
                        CountRestart;
                        exit;
                endif;
        endif
        SendNak;
        exit;
endif
if (SerialBuffer(SerialRPointer) and "F0h") = "40h" then   /   Operation mode command
        if SerialBuffer(SerialRPointer)<"45h"
        then
                if (MultiModeF and AddressExist and not(AddressSelected))
                then
                /   When addresses do not coincide with each other in multimode,
                /   ignore command.
                        RenewSRP;;
                        AddressSelected = false;
                        AddressExist = false;
                        exit;
                else
                        Breg = OperationMode;
                        OperationMode = SerialBuffer(SerialRPointer) and "00000111b";
                        if Breg<>OperationMode then
                                /   When operation mode is changed
                                WriteToFlash;
                                CountRestart;
```

```
                    endif;
                    SendAck;
                    exit;
            endif
        else
            SendNak;
            exit;
        endif
endif
if SerialBuffer(SerialRPointer) = "7Fh" then MultiModeF = true;
if SerialBuffer(SerialRPointer) = "7Eh" then MultiModeF = false;
if SerialBuffer(SerialRPointer) = ("7Eh" or "7Fh") then
/ Multimode command reception processing
        WriteToFlash;
        CountRestart;
        Sirent;
        exit;
endif
if SerialBuffer(SerialRPointer) < "80h" then
        SendNak;
        exit;
endif;
if not(MultiModeF) then
        SendNak;
        exit;
endif;
AddressExist = true;
if (SerialBuffer(SerialRPointer) and "00111111b") = #ModuleAddress
then AddressSelected = true;
else AddressSelected = false;
/ Comparison between module address and designated address
endif;
if SerialBuffer(SerialRPointer) >= "C0h"
then
/ Select command input address in multimode.
        RenewSRP;;
        exit;
else
/ Read random number data in multimode.
        if IntervalWPointer=IntervalRPointer
        then
/ When there is no random number data
                SendNakWhenNoData;
                exit;
        else
/ When there is random number data
                if AddressSelected then
                / When address is selected
                        ReadIntervalTime;
                        / Read time measured value.
                        ConvertToUniform;
                        / Conversion to uniform distribution random number
```

```
                    CalcProb;
                    /  Probability judgment
                    if EXPDataOutF then SendRandomEXP;
                    if UniformDataOutF then SendRandomUniform;
                    /  Output random number.
                endif;
                Sirent;
        endif;
endif;
```

/ SendNak /   Transmission of NAK code
if (not(MultiModeF) or (AddressExist and AddressSelected) then SerialOutput = #SNAK;
/   When addresses do not coincide with each other in multimode, do not transmit NAK.
AddressSelected = false;
AddressExist = false;
SerialRPointer += 1;
SerialRPointer = SerialRPointer and #ConstSPFilter;
/   Update serial read pointer.
NumberOFNewData -= 1;

/ SendNakWhenNoData /   When random number is read in multimode but there is no
                    /   random number
SerialOutput = #SNAK;
AddressSelected = false;
AddressExist = false;
NumberOFNewData -= 1;

/ SendAck /     Transmission of ACK code
if (not(MultiModeF) or (AddressExist and AddressSelected) then SerialOutput = #SACK;
/   When addresses do not coincide with each other in multimode, do not transmit ACK.
AddressSelected = false;
AddressExist = false;
SerialRPointer += 1;
SerialRPointer = SerialRPointer and #ConstSPFilter;
/   Update serial read pointer.
NumberOFNewData -= 1;

/ RenewSRP /    Update of serial pointer
SerialRPointer += 1;
SerialRPointer = SerialRPointer and #ConstSPFilter;
NumberOFNewData -= 1;

/ Sirent / Do nothing with invalid data.
AddressSelected = false;
AddressExist = false;
SerialRPointer += 1;
SerialRPointer = SerialRPointer and #ConstSPFilter;
NumberOFNewData -= 1;

/ WriteToFlash /   Writing of data in flash memory
FlashCPS = CPS;
FlashCPSMT = CPSMeasureTime;

```
FlashNofP = NumberOfPulse;
StatusFlag = FlashStatus;
FlashOPMode = OperationMode;
FlashLastCPSAccumulation = LastCPSAccumulation;
FlashPROB(0..7) = PROB(o..7);
FlashPT(0..7) = Pvalue(0..7);

/ ConvertToUniform /    Conversion to uniform distribution random number
if RandomEXP[23..16]<>"0"
then
/   When exponential distribution random number exceeds "FFh", set random number
/   to "FFh".
        UniformedData = "FFh";
else
/   Conversion to uniform distribution in accordance with binary search
        BitIndicator = 10000000b;
        UniformedData = "0";
        repeat
                UniformedData = UniformedData xor BitIndicator;
                if RandomEXP < DataTable(UniformedData)
                then UniformedData = UniformedData xor BitIndicator;
                endif;
                Carry = "0";
                RightLotateWithCarry(BitIndicator, 1bit);
        until Carry="1";
endif;

/ CalcTPreScaler /   Calculate prescaler value of Timer2 from CPS
/ In the case of this computation, when number of pulses for 64 sec (CPS value) ranges
/ between 0 and 3, accurate prescaler value is not obtained.   Confirmation is
/ previously necessary > Broach with CPSMAX and CPSMIN
a as M32 {
        aH as M[16];
        aL as M[16];
}
CycleCounter as M[8];

a = 2246Dh;
CycleCounter=16;
LeftShiftWithCarry(a,1bit);
repeat
        if CPSForceF
        then
        /   When CPS value is forcibly set, use forcible set data.
                if (aH-CPSForceData)>=0
                then
                        Carry = 1;
                        aH = aH - CPSForceData;
                else Carry = 0;
        else
                if (aH-CPS)>=0
```

```
                    then
                            Carry = 1;
                            aH = aH − CPS;
                    else Carry = 0;
            endif;
            LeftShiftWithCarry(a,1bit);
            CycleCounter = CycleCounter − 1;
until CycleCounter=0;
Timer2ReloadREG = aL;

/ CalcPThreshold /   Calculate time counting threshold for probability judgment used
/   inside from probability set value and perform logarithm calculation.
/   For processing contents, refer to design specification.
W as M[32] {
        W0 as M[8];
        W1 as M[8];
        W2 as M[8];
        W3 as M[8]; /Computing buffer X
}
X as M[32] {
        X0 as M[8];
        X1 as M[8];
        X2 as M[8];
        X3 as M[8]; /Computing buffer X
}
Y as M[32] {
        Y0 as M[8];
        Y1 as M[8];
        Y2 as M[8];
        Y3 as M[8]; /Computing buffer Y
}
LogA as M[32] {
        LogA0 as M[8];
        LogA1 as M[8];
        LogA2 as M[8];
        LogA3 as M[8]; /Computing buffer W
}
Z as M[32] {
        Z0 as M[8];
        Z1 as M[8];
        Z2 as M[8];
        Z3 as M[8]; /Computing buffer Z
}
ZZ as M[32] {
        ZZ0 as M[8];
        ZZ1 as M[8];
        ZZ2 as M[8];
        ZZ3 as M[8]; /Computing buffer ZZ
}
Result as M[32] {
        Result0 as M[8];
        Result1 as M[8];
```

Result2 as M[8];
　　　　　Result3 as M[8]; /Computing buffer ZZ
}
LogASign as M[1]; /Symbol of Log(A)

CalcAB;
CalcZ;
CalcZZ;
CalcLogA;
CalcLogB;
CalcResult;

/ CalcAB /
B as M[8];

X1&X2=P(PArg);
X0=X3=0;
B="0Fh";
repeat
　　　　LeftShift(X, 1 bit);
　　　　B -= 1;
until X0.bit0="1";   /Result: There is A in X.

/ CalcZ /
Root2 as "01.6A09E6";
CycleCounter as M[8]

Y=X;   /Set A to both buffers X and Y.
X=X - Root2;   /Calculate X = (a-√2), and if a result is negative, use complement.
if X<0 then
　　　　X= 0 – X;
　　　　LogASign = true;
else
　　　　LogASign = false;
end if
Y=Y + Root2;   /Calculation of Y = (a+√2)

CycleCounter = 22; /Bit length of divisor y
z = 0;   /Thereafter, Calculation of Z=X/Y
ShiftLeft(X, 2bit)
Repeat
　　　　if (X-Y) > 0
　　　　then
　　　　　　　Carry = "1"; /Set least significant bit of result z to "1".
　　　　　　　X =X - Y;
　　　　else
　　　　　　　Carry = "0"; /Reset least significant bit of result z to "0".
　　　　end if
　　　　ShiftLeftWithC(Z, 1bit);
　　　　ShiftLeft(X, 1bit);
　　　　CycleCounter = CycleCounter – 1;
until CycleCounter=0   ;   /Computation result is left in Z.

/ CalcZZ /
CycleCounter as M[8];

X = Z;
X = Z;
WeqXmulY;
ZZ = W;

/ CalcLogA /
Const10 as "01.000000h";   /1
Const03 as "00.555555h";   /0.3333333
Const02 as "00.333333h";   /0.2
Const07 as "00.249248h";   /".0010 0100 1001 0010 0100 1000" = 0.1428571
CycleCounter as M[8];

/          Compute ZZ/7. Because of variable×constant, perform simple shift at bit
/          position when constant is "0" and perform addition at bit position when
/          constant is "1" so as to shorten processing time.
Y = ZZ;
X = 0;
CycleCounter = 7
repeat
        ShiftRight(Y(1..3), 3bit);
        X(1..3) = X(1..3)+Y(1..3);
        CycleCounter -= 1;
until CycleCounter = 0;   /Result is left in X.

X = X + Const02;

Y = ZZ            ;       /Computation of zz*(0.2 + zz*0.1428571)
WeqXmulY;

W = W + Const03;

Y = ZZ            ;       /Computation of zz*(0.3333333 + zz*(0.2 + zz*0.1428571))
X = 0;
WeqXmulY;

W = W + Const10;

Y = Z             ;       /2*z*(1 + zz*(0.3333333 + zz*(0.2 + zz*0.1428571)))
X = W;
WeqXmulY4;
LogA = 2 * W;

/ CalcLogB /
Const05 as "00.800000h";
ConstLog2 as "0B17217Fh";   /To simply computation, insert Log(2)*16.

X = B + 0.5
W = 0;

Y = ConstLog2;

CycleCounter = 5;          /X=(B+0.5)*Log(2)
repeat
        if W0.bit3="1" then W = W + Y;
        ShiftRight(Y,1bit);
        ShiftLeft(W(0..1),1bit)
until CycleCounter = 0;    /Result is left in X.

/ CalcResult /
ConstN as ("00.2BF7C4h" shl 2) = "0.1010 1111 1101 1111 0001 0000";   0.1717494 *4
= 4/5.822436 if LogASign
then W = W + LogA
else W = W – LogA;

Result = 0;
Y = ConstN;
CycleCounter=22;
repeat
        ShiftLeft(Y(1..3),1bit)
        if Carry="1" then Result = Result + X;
        ShiftRight(X,1bit);
until CycleCounter = 0;    /Result is left in Result / WeqXmulY /
/ Computation of W = X * Y (Calculate only decimal point or lower)
W = 0;
CycleCounter=24;
repeat
        ShiftRight(X(1..3),1bit);
        ShiftLeft(Y(1..3),1bit)
        if Carry="1" then W = W + X;
until CycleCounter = 0;    /Result is left in W.

/ WeqXmulY4 /
/ Computation of W = X * Y (Calculation of four digits, X is four digits, and Y is only
/ a case of less than 1)
W = 0;
CycleCounter=24;
repeat
        ShiftRight(X,1bit);
        ShiftLeft(Y,1bit)
        if Carry="1" then W = W + X;
until CycleCounter = 0;    /  Result is left in W.

/ FlashROMDataArea /   Data region in flash memory
/ Insert default value of each data as initial value.

FlashCPS as M[16] = "00C0h";

FlashCPSMT as M[8] = "01h";
FlashNofP as M[24] = "FFFFFFh";
FlashStatus as M[8] = "00h";
FlashOPMode as M[8] = "00010011b";
;      bit2 : Demo mode
;      bit1 : Exponential distribution random number output
;      bit0 : Uniform distribution random number output
FlashLastCPSAccumulation as M[24] = "0000C0h";
FlashPROB(8) as M[16] =
("0002h", "0003h", "0005h", "0010h", "0080h", "0100h", "1000h", "8000h");
FlashPT(8) as M[17] =
("001D8Dh", "002ED7h", "00449Eh", "00CEDEh", "00EC6Ch", "0162A2h", "01BB4Ah");
ModuleAddress as M[8] = "FFh";
FlashVer as String = "RGZ-1 Ver 1.00", "0Dh", "0Ah", "2004-05-10", "0Dh", "0Ah", "CopyRight 2004, RPG Technics & Zixsys Inc.", "FFh";

The invention claimed is:

1. A semiconductor device constituted so as to generate a random number and/or probability by setting a random pulse generation source (RPG) for spontaneously generating random pulses, said RPG comprising an emitter for discharging α particles or beta rays, or α particles and beta rays (particles) discharged due to nuclear decay and selected from the group consisting of all nuclear species of uranium series, all nuclear species of thorium series, all species of $^{210}$Pb-$^{210}$Po or the like forming the radioactive equilibrium between these nuclear species, $^{244}$Cm, and $^{241}$Am; measuring the time interval between the random pulses generated from the RPG or measuring a voltage value of the random pulse, and converting it into a digital value.

2. The semiconductor device according to claim 1, characterized in that
the RPG further includes a detector for detecting discharged α particles or the like, the emitter is used as a solution, and the solution is dripped on the detection face of the detector, or a member on which the solution is evaporated or which is formed into a panel by a roller method is faced with the detector, spacing a predetermined distance.

3. The semiconductor device according to claim 2, characterized in that
the detector includes a PN-type semiconductor, PNP-type semiconductor, PIN photodiode, phototransistor, or photodiode.

4. The semiconductor device according to claim 1, characterized in that
the RPG further includes a shielding wall for shielding the emitter and the shielding wall shields at least the distance of the range of a particles to be used.

5. The semiconductor device according to claim 1, characterized in that
an exponential distribution random number and/or uniform random number having a predetermined bit length and/or a probability are generated from random pulses generated from the RPG.

6. The semiconductor device according to claim 5, characterized in that
a necessary number of probabilities are obtained from an exponential distribution showing a probability in which the same pulse interval occurs between pulses generated from the RPG to prepare a uniform random number in accordance with the probability.

7. The semiconductor device according to claim 6, characterized in that
when obtaining a probability from the time interval between t1 and t2 by using the exponential distribution, a pulse having a predetermined probability is recognized when exceeding the time t1 by assuming that the time t2 is infinite time.

8. The semiconductor device according to claim 5, characterized in that
when preparing a random number from an exponential distribution, an appearance probability density distribution in which an exponential distribution random number and uniform distribution random number are stabilized is realized by fluctuating a basic cycle for measurement and performing the same computation even if the average discharge rate of pulses is fluctuated.

9. The semiconductor device according to claim 8, characterized in that
a distribution of exponential distribution random numbers is stabilized by fluctuating a basic cycle for measurement when preparing a random number from an exponential distribution and generation of a uniform distribution random number and generation of a probability are simultaneously processed.

10. The semiconductor device according to claim 8, characterized in that
fluctuation of an operation clock for an oscillation frequency of hardware such as microcomputer for measuring time is automatically corrected by fluctuating a basic cycle for measurement when preparing a random number form an exponential distribution.

11. The semiconductor device according to claim 1, characterized in that a random number generated from the RPG is stored as an identification signal or anticlone signal and a signal input from the outside is compared and authenticated with the stored signal.

12. The semiconductor device according to claim 11, characterized in that
a new random number is rewritten as authentication data whenever the comparison and authentication are performed.

13. The semiconductor device according to claim 11, characterized in that
authentication data is transmitted and received.

14. The semiconductor device according to claim 13, characterized in that
transmission and reception of the authentication data is performed through radio communication, infrared data communication, or communication of circuit connection method by contact.

15. The IC card, IC tag, PC connectable unit, or unit built-in module including the semiconductor device according to claim 1.

16. A method for generating a random number and/or probability, comprising the steps of:
measuring the time interval between the random pulses generated from a random pulse generation source (RPG) for spontaneously generating random pulses, said RPG comprising an emitter for discharging α particles or beta rays, or α particles and beta rays (particles) discharged due to nuclear decay and selected from the group consisting of all nuclear species of uranium series, all nuclear species of thorium series, all species of $^{210}$Pb-$^{210}$Po or the like forming the radioactive equilibrium between these nuclear species, $^{244}$Cm, and $^{241}$Am, or measuring a voltage value of the random pulse, and converting it into a digital value using a computer, and
generating an exponential distribution random number and/or uniform random number having a predetermined bit length and/or a probability from random pulses as converted to digital values using the computer.

17. The method according to claim 16, characterized in that the step of generating an exponential distribution random number and/or uniform random number having a predetermined bit length and/or a probability from random pulses, obtains a necessary number of probabilities from an exponential distribution showing a probability in which the same pulse interval occurs between pulses generated from the RPG to prepare a uniform random number in accordance with the probability.

18. The method according to claim 17, characterized in that the step of generating an exponential distribution random number and/or uniform random number having a predetermined bit length and/or a probability from random pulses, recognizes, in obtaining a probability from the time interval between t1 and t2 by using the exponential distribution, a pulse having a predetermined probability when exceeding the time t1 by assuming that the time t2 is infinite time.

19. The method according to claim 16, characterized in that the step of generating an exponential distribution random number and/or uniform random number having a predetermined bit length and/or a probability from random pulses, realizes, in preparing a random number from an exponential distribution, an appearance probability density distribution in which an exponential distribution random number and uniform distribution random number are stabilized, by fluctuating a basic cycle for measurement and performing the same computation even if the average discharge rate of pulses is fluctuated.

20. The method according to claim 16, characterized in that the step of generating an exponential distribution random number and/or uniform random number having a predetermined bit length and/or a probability from random pulses, stabilizes a distribution of exponential distribution random numbers by fluctuating a basic cycle for measurement when preparing a random number from an exponential distribution and processes generation of a uniform distribution random number and generation of a probability simultaneously.

21. The method according to claim 20, characterized in that the step of generating an exponential distribution random number and/or uniform random number having a predetermined bit length and/or a probability from random pulses, automatically corrects fluctuation of an operation clock for an oscillation frequency of hardware such as microcomputer for measuring time by fluctuating a basic cycle for measurement when preparing a random number form an exponential distribution.

22. A computer readable non-transitory media storing a program for executing a method for generating a random number and/or probability, said method comprising the steps of:
measuring the time interval between random pulses generated from a random pulse generation source (RPG) for spontaneously generating random pulses, said RPG comprising an emitter for discharging $\alpha$ particles or beta rays, or $\alpha$ particles and beta rays (particles) discharged due to nuclear decay and selected from the group consisting of all nuclear species of uranium series, all nuclear species of thorium series, all species of $^{210}$Pb-$^{210}$Po or the like forming the radioactive equilibrium between these nuclear species, $^{244}$Cm, and $^{241}$Am, or measuring a voltage value of the random pulses, and converting it into a digital value using a computer, and
generating an exponential distribution random number and/or uniform random number having a predetermined bit length and/or a probability from random pulses as converted to digital values using the computer.

23. The media according to claim 22, characterized in that the step of generating an exponential distribution random number and/or uniform random number having a predetermined bit length and/or a probability from random pulses, obtains a necessary number of probabilities from an exponential distribution showing a probability in which the same pulse interval occurs between pulses generated from the RPG to prepare a uniform random number in accordance with the probability.

24. The media according to claim 23, characterized in that the step of generating an exponential distribution random number and/or uniform random number having a predetermined bit length and/or a probability from random pulses, recognizes, in obtaining a probability from the time interval between t1 and t2 by using the exponential distribution, a pulse having a predetermined probability when exceeding the time t1 by assuming that the time t2 is infinite time.

25. The media according to claim 22, characterized in that the step of generating an exponential distribution random number and/or uniform random number having a predetermined bit length and/or a probability from random pulses, realizes, in preparing a random number from an exponential distribution, an appearance probability density distribution in which an exponential distribution random number and uniform distribution random number are stabilized, by fluctuating a basic cycle for measurement and performing the same computation even if the average discharge rate of pulses is fluctuated.

26. The media according to claim 22, characterized in that the step of generating an exponential distribution random number and/or uniform random number having a predetermined bit length and/or a probability from random pulses, stabilizes a distribution of exponential distribution random numbers by fluctuating a basic cycle for measurement when preparing a random number from an exponential distribution and processes generation of a uniform distribution random number and generation of a probability simultaneously.

27. The media according to claim 26, characterized in that the step of generating an exponential distribution random number and/or uniform random number having a predetermined bit length and/or a probability from random pulses, automatically corrects fluctuation of an operation clock for an oscillation frequency of hardware such as microcomputer for measuring time by fluctuating a basic cycle for measurement when preparing a random number form an exponential distribution.

* * * * *